(12) United States Patent
Han et al.

(10) Patent No.: US 12,150,369 B2
(45) Date of Patent: Nov. 19, 2024

(54) DISPLAY PANEL, DISPLAY DEVICE, TEST METHOD AND CRACK DETECTION METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Meng Zhang, Beijing (CN); Yi Zhang, Beijing (CN); Pengfei Yu, Beijing (CN); Shikai Qin, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 842 days.

(21) Appl. No.: 17/275,230

(22) PCT Filed: May 19, 2020

(86) PCT No.: PCT/CN2020/091017
§ 371 (c)(1),
(2) Date: Mar. 11, 2021

(87) PCT Pub. No.: WO2021/232230
PCT Pub. Date: Nov. 25, 2021

(65) Prior Publication Data
US 2022/0115463 A1    Apr. 14, 2022

(51) Int. Cl.
*H01L 27/32* (2006.01)
*G09G 3/00* (2006.01)
(Continued)

(52) U.S. Cl.
CPC ............ *H10K 59/88* (2023.02); *G09G 3/006* (2013.01); *H10K 59/1216* (2023.02);
(Continued)

(58) Field of Classification Search
None
See application file for complete search history.

(56) References Cited

U.S. PATENT DOCUMENTS

2003/0043132 A1* 3/2003 Nakamura ........... G09G 3/3233
345/204
2016/0372017 A1 12/2016 Byun et al.
(Continued)

FOREIGN PATENT DOCUMENTS

CN     101038300 A    9/2007
CN     101419345 A    4/2009
(Continued)

*Primary Examiner* — Benjamin C Lee
*Assistant Examiner* — Emily J Frank
(74) *Attorney, Agent, or Firm* — The Webb Law Firm

(57) ABSTRACT

The present disclosure provides a display panel, a display device, a test method, and a crack detection method. The display panel includes: a base substrate including a display area and a peripheral area; a plurality of sub-pixels in the display area; a plurality of data signal lines in the display area and electrically connected to the plurality of sub-pixels; a plurality of signal transmission lines in the peripheral area and electrically connected to the plurality of data signal lines; a plurality of multiplexers in the peripheral area; and a first test circuit on a side of the plurality of multiplexers away from the plurality of sub-pixels. The first test circuit includes a plurality of test components, each of at least a portion of the plurality of test components being electrically connected to at least two multiplexers.

17 Claims, 15 Drawing Sheets

(51) Int. Cl.
  *H01L 51/00* (2006.01)
  *H01L 51/56* (2006.01)
  *H10K 59/121* (2023.01)
  *H10K 59/122* (2023.01)
  *H10K 59/124* (2023.01)
  *H10K 59/131* (2023.01)
  *H10K 59/88* (2023.01)
  *H10K 71/00* (2023.01)
  *H10K 71/70* (2023.01)

(52) U.S. Cl.
  CPC ......... *H10K 59/122* (2023.02); *H10K 59/124* (2023.02); *H10K 59/131* (2023.02); *H10K 71/00* (2023.02); *H10K 71/70* (2023.02); *G09G 2300/0809* (2013.01); *G09G 2330/12* (2013.01)

(56) References Cited

U.S. PATENT DOCUMENTS

| | | | |
|---|---|---|---|
| 2019/0057632 A1* | 2/2019 | Kim | G09G 3/3266 |
| 2020/0019031 A1* | 1/2020 | Koide | G02F 1/136286 |
| 2020/0265783 A1* | 8/2020 | Lee | G09G 3/3266 |
| 2021/0225222 A1* | 7/2021 | Shim | G09G 3/006 |
| 2021/0241686 A1* | 8/2021 | Cheng | H10K 59/131 |
| 2021/0376047 A1 | 12/2021 | Xue et al. | |

FOREIGN PATENT DOCUMENTS

| | | |
|---|---|---|
| CN | 101425247 A | 5/2009 |
| CN | 102968946 A | 3/2013 |
| CN | 110379346 A | 10/2019 |
| CN | 110634930 A | 12/2019 |
| KR | 1020170113869 A | 10/2017 |

* cited by examiner

Transmit a data signal to a multiplexer electrically connected to each test component by the each test component under the control of a test switch signal — S1702

Transmit the data signal to a corresponding sub-pixel by the multiplexer under the control of a selection signal — S1704

DISPLAY PANEL, DISPLAY DEVICE, TEST METHOD AND CRACK DETECTION METHOD

CROSS-REFERENCE TO RELATED APPLICATIONS

The present application is a U.S. National Stage Application under 35 U.S.C. § 371 of International Patent Application No. PCT/CN2020/091017, filed on May 19, 2020, the disclosure of which is incorporated by reference herein in its entirety.

TECHNICAL FIELD

The present disclosure relates to a display panel, a display device, a test method and a crack detection method.

BACKGROUND

At present, multiplexers have been gradually applied to display screens, with the advantage of capable of reducing the number of data signal lines, thereby reducing costs. Multiplexers are usually located on a side of a test circuit away from a display area. In this way, the multiplexers are not enabled when a detection operation is performed by the test circuit. When the display modules are lighted up, the multiplexers can serve to transmit data signals.

SUMMARY

According to an aspect of embodiments of the present disclosure, a display panel is provided. The display panel comprises: a base substrate comprising a display area and a peripheral area on at least one side of the display area; a plurality of sub-pixels on a side of the base substrate and in the display area; a plurality of data signal lines in the display area and electrically connected to the plurality of sub-pixels; a plurality of signal transmission lines in the peripheral area and electrically connected to the plurality of data signal lines; a plurality of multiplexers in the peripheral area and on a side of the plurality of signal transmission lines away from the plurality of sub-pixels, at least one of the plurality of multiplexers being electrically connected to at least two signal transmission lines; and a first test circuit in the peripheral area and on a side of the plurality of multiplexers away from the plurality of sub-pixels, the first test circuit comprising a plurality of test components, each test component of at least a portion of the plurality of test components being electrically connected to at least two of the plurality of multiplexers, and the each test component comprising a first test sub-circuit, a second test sub-circuit and a third test sub-circuit, the second test sub-circuit being between the first test sub-circuit and the third test sub-circuit, and the first test sub-circuit being on a side of the second test sub-circuit away from the plurality of sub-pixels.

In some embodiments, an orthographic projection of the first test sub-circuit on the base substrate is centrosymmetric.

In some embodiments, two adjacent multiplexers of the plurality of multiplexers are electrically connected to one of the plurality of test components through two connection wires.

In some embodiments, the plurality of multiplexers comprise a first multiplexer and a second multiplexer; the first test sub-circuit comprises: a first transistor, a first electrode of the first transistor being configured to receive a first data signal, a second electrode of the first transistor being electrically connected to an input terminal of the first multiplexer, and a control electrode of the first transistor being configured to receive a first test switch signal; and a second transistor, a first electrode of the second transistor being configured to receive a second data signal, a second electrode of the second transistor being electrically connected to an input terminal of the second multiplexer, and a control electrode of the second transistor being configured to receive a second test switch signal; the second test sub-circuit comprises: a third transistor, a first electrode of the third transistor being configured to receive a third data signal, a second electrode of the third transistor being electrically connected to the input terminal of the first multiplexer, and a control electrode of the third transistor being configured to receive a third test switch signal; and a fourth transistor, a first electrode of the fourth transistor being configured to receive a fourth data signal, a second electrode of the fourth transistor being electrically connected to the input terminal of the first multiplexer, and a control electrode of the fourth transistor being configured to receive a fourth test switch signal; and the third test sub-circuit comprises: a fifth transistor, a first electrode of the fifth transistor being configured to receive a fifth data signal, a second electrode of the fifth transistor being electrically connected to the input terminal of the second multiplexer, and a control electrode of the fifth transistor being configured to receive a fifth test switch signal; and a sixth transistor, a first electrode of the sixth transistor being configured to receive a sixth data signal, a second electrode of the sixth transistor being electrically connected to the input terminal of the second multiplexer, and a control electrode of the sixth transistor being configured to receive a sixth test switch signal.

In some embodiments, the display panel further comprises: a first control line electrically connected to the control electrode of the first transistor and the control electrode of the second transistor and configured to transmit the first test switch signal and the second test switch signal, the first test switch signal being the same as the second test switch signal; a first data line electrically connected to the first electrode of the first transistor and configured to transmit the first data signal; and a second data line electrically connected to the first electrode of the second transistor and configured to transmit the second data signal; wherein an orthographic projection of the first control line on the base substrate is between an orthographic projection of the first data line on the base substrate and an orthographic projection of the second data line on the base substrate.

In some embodiments, the two connection wires comprise a first connection wire and a second connection wire, wherein: the second electrode of the first transistor is electrically connected to the first connection wire, and the second electrode of the second transistor is electrically connected to the second connection wire; an orthographic projection of the control electrode of the first transistor on the base substrate is between an orthographic projection of the first electrode of the first transistor on the base substrate and an orthographic projection of the second electrode of the first transistor on the base substrate; an orthographic projection of the control electrode of the second transistor on the base substrate is between an orthographic projection of the first electrode of the second transistor on the base substrate and an orthographic projection of the second electrode of the second transistor on the base substrate; and the orthographic projection of the first electrode of the first transistor on the base substrate and the orthographic projection of the first electrode of the second transistor on the base substrate are between the orthographic projection of the control electrode of the first transistor on the base substrate and the orthographic projection of the control electrode of the second transistor on the base substrate.

In some embodiments, he third transistor comprises two first electrodes, one second electrode, and two control electrodes; and the fourth transistor comprises two first electrodes, one second electrode, and two control electrodes; and the display panel further comprises: a second control line electrically connected to the two control electrodes of the third transistor and configured to transmit the third test switch signal; a third data line electrically connected to one of the two first electrodes of the third transistor and configured to transmit the third data signal; a fourth data line electrically connected to another of the two first electrodes of the third transistor and configured to transmit the third data signal; a third control line electrically connected to the two control electrodes of the fourth transistor and configured to transmit the fourth test switch signal; a fifth data line electrically connected to one of the two first electrodes of the fourth transistor and configured to transmit the fourth data signal; and a sixth data line electrically connected to another of the two first electrodes of the fourth transistor and configured to transmit the fourth data signal; wherein an orthographic projection of the second control line on the base substrate is between an orthographic projection of the third control line on the base substrate and an orthographic projection of the sixth data line on the base substrate, the orthographic projection of the third control line on the base substrate is between the orthographic projection of the second control line on the base substrate and an orthographic projection of the third data line on the base substrate, and the orthographic projection of the third data line on the base substrate and the orthographic projection of the sixth data line on the base substrate are between an orthographic projection of the third transistor on the base substrate and an orthographic projection of the fourth transistor on the base substrate.

In some embodiments, the second electrode of the third transistor and the second electrode of the fourth transistor are electrically connected to the first connection wire; an orthographic projection of one of the two control electrodes of the third transistor on the base substrate is between an orthographic projection of the one of the two first electrodes of the third transistor on the base substrate and an orthographic projection of the second electrode of the third transistor on the base substrate, and an orthographic projection of another of the two control electrodes of the third transistor on the base substrate is between an orthographic projection of the another of the two first electrodes of the third transistor on the base substrate and the orthographic projection of the second electrode of the third transistor on the base substrate; and an orthographic projection of one of the two control electrodes of the fourth transistor on the base substrate is between an orthographic projection of the one of the two first electrodes of the fourth transistor on the base substrate and an orthographic projection of the second electrode of the fourth transistor on the base substrate, and an orthographic projection of another of the two control electrodes of the fourth transistor on the base substrate is between an orthographic projection of the another of the two first electrodes of the fourth transistor on the base substrate and the orthographic projection of the second electrode of the fourth transistor on the base substrate.

In some embodiments, the fifth transistor comprises two first electrodes, one second electrode, and two control electrodes; and the sixth transistor comprises two first electrodes, one second electrode, and two control electrodes; the display panel further comprises: a fourth control line electrically connected to the two control electrodes of the fifth transistor and configured to transmit the fifth test switch signal; a seventh data line electrically connected to one of the two first electrodes of the fifth transistor and configured to transmit the fifth data signal; an eighth data line electrically connected to another of the two first electrodes of the fifth transistor and configured to transmit the fifth data signal; a fifth control line electrically connected to the two control electrodes of the sixth transistor and configured to transmit the sixth test switch signal; a ninth data line electrically connected to one of the two first electrodes of the sixth transistor and configured to transmit the sixth data signal; and a tenth data line electrically connected to another of the two first electrodes of the sixth transistor and configured to transmit the sixth data signal; wherein an orthographic projection of the fourth control line on the base substrate is between an orthographic projection of the fifth control line on the base substrate and an orthographic projection of the ninth data line on the base substrate, the orthographic projection of the fifth control line on the base substrate is between the orthographic projection of the fourth control line on the base substrate and an orthographic projection of the seventh data line on the base substrate, and the orthographic projection of the seventh data line on the base substrate and the orthographic projection of the ninth data line on the base substrate are between an orthographic projection of the fifth transistor on the base substrate and an orthographic projection of the sixth transistor on the base substrate.

In some embodiments, the second electrode of the fifth transistor and the second electrode of the sixth transistor are electrically connected to the second connection wire; an orthographic projection of one of the two control electrodes of the fifth transistor on the base substrate is between an orthographic projection of the one of the two first electrodes of the fifth transistor on the base substrate and an orthographic projection of the second electrode of the fifth transistor on the base substrate, and an orthographic projection of another of the two control electrodes of the fifth transistor on the base substrate is between an orthographic projection of the another of the two first electrodes of the fifth transistor on the base substrate and the orthographic projection of the second electrode of the fifth transistor on the base substrate; and an orthographic projection of one of the two control electrodes of the sixth transistor on the base substrate is between an orthographic projection of the one of the two first electrodes of the sixth transistor on the base substrate and an orthographic projection of the second electrode of the sixth transistor on the base substrate, and an orthographic projection of another of the two control electrodes of the sixth transistor on the base substrate is between an orthographic projection of the another of the two first electrodes of the sixth transistor on the base substrate and the orthographic projection of the second electrode of the sixth transistor on the base substrate.

In some embodiments, each of the plurality of multiplexers comprises a seventh transistor and an eighth transistor, wherein the seventh transistor and the eighth transistor share a first electrode serving as an input terminal of the each of the plurality of multiplexers, a second electrode of the seventh transistor is electrically connected to one of the at least two signal transmission lines, a control electrode of the seventh transistor is configured to receive a first selection signal, a second electrode of the eighth transistor is electrically connected to another of the at least two signal transmission lines, and a control electrode of the eighth transistor is configured to receive a second selection signal.

In some embodiments, at least one sub-pixel of the plurality of sub-pixels comprises a ninth transistor and a capacitor; the ninth transistor comprising: an active layer; a first insulating layer covering the active layer; a gate on a side of the first insulating layer away from the active layer; a second insulating layer covering the gate; an interlayer insulating layer on a side of the second insulating layer away from the gate; and a source and a drain both on a side of the interlayer insulating layer away from the second insulating layer, wherein the source and the drain each are electrically connected to the active layer; and the capacitor comprising: a first conductive layer in the same layer as the gate and being covered by the second insulating layer; and a second conductive layer on a side of the second insulating layer away from the first conductive layer and being covered by the interlayer insulating layer.

In some embodiments, the at least one sub-pixel further comprises: a third insulating layer covering the source and the drain; a planarization layer on a side of the third insulating layer away from the source and the drain; an anode layer on a side of the planarization layer away from the third insulating layer, wherein the anode layer is electrically connected to the source or the drain; a pixel defining layer on a side of the planarization layer away from the third insulating layer and having an opening exposing at least a portion of the anode layer; a functional layer at least within the opening and connected to the anode layer; and a cathode layer on a side of the functional layer away from the anode layer.

In some embodiments, the first connection wire is in the same layer as the second conductive layer, and the second connection wire is in the same layer as the gate; the first control line to the fifth control line and the first data line to the tenth data line are all in the same layer as the source or the drain; and control electrodes of the first transistor to the sixth transistor are in the same layer as the gate, active layers of the first transistor to the sixth transistor are in the same layer as the active layer of the ninth transistor, first electrodes of the first transistor to the sixth transistor are all in the same layer as the source or the drain, and second electrodes of the first transistor to the sixth transistor are all in the same layer as the source or the drain.

In some embodiments, the display panel further comprises: a second test circuit comprising a plurality of tenth transistors being electrically connected to the plurality of multiplexers in one-to-one correspondence; wherein a first electrode of each of the plurality of tenth transistors is configured to receive a detection voltage signal, a second electrode of the each of the plurality of tenth transistors is electrically connected to the input terminal of a multiplexer corresponding to the each of the plurality of tenth transistors, and a control electrode of the each of the plurality of tenth transistors is configured to receive a seventh test switch signal.

In some embodiments, the display panel further comprises: a first signal access terminal group in the peripheral area and on a side of the first test circuit in an extension direction along a boundary between the display area and the peripheral area, the first signal access terminal group being electrically connected to the first test circuit; and a second signal access terminal group in the peripheral area and on a side of the first test circuit away from the first signal access terminal group in the extension direction along the boundary between the display area and the peripheral area, the second signal access terminal group being electrically connected to the first test circuit.

According to another aspect of the embodiments of the present disclosure, a display device is provided. The display device comprising a display panel as described above.

According to another aspect of the embodiments of the present disclosure, a test method for a display panel as described above is provided. The test method comprises: transmitting a data signal to a multiplexer electrically connected to the each test component by the each test component under a control of a test switch signal; and transmitting the data signal to a corresponding sub-pixel by the multiplexer under a control of a selection signal.

According to another aspect of the embodiments of the present disclosure, a crack detection method for a display panel as described above is provided. The crack detection method comprises: providing the detection voltage signal and the seventh test switch signal to the each of the plurality of tenth transistors; providing the first selection signal to the seventh transistor and providing the second selection signal to the eighth transistor; and determining that the display panel has a crack in a case where the display panel displays a bright line.

In some embodiments, the determining that the display panel has the crack comprises: determining that the display panel has the crack if the display panel displays a white bright line in a case where the first selection signal and the second selection signal cause the seventh transistor and the eighth transistor to be turned on alternately; determining that the display panel has the crack if the display panel displays a green bright line in a case where the first selection signal turns off the seventh transistor and the second selection signal turns on the eighth transistor; or determining that the display panel has the crack if the display panel displays a magenta bright line in a case where the first selection signal turns on the seventh transistor and the second selection signal turns off the eighth transistor.

Other features and advantages of the present invention will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate embodiments of the present disclosure and, together with this specification, serve to explain the principles of the present disclosure.

The present disclosure may be more clearly understood from the following detailed description with reference to the accompanying drawings, in which.

Figure 1A:
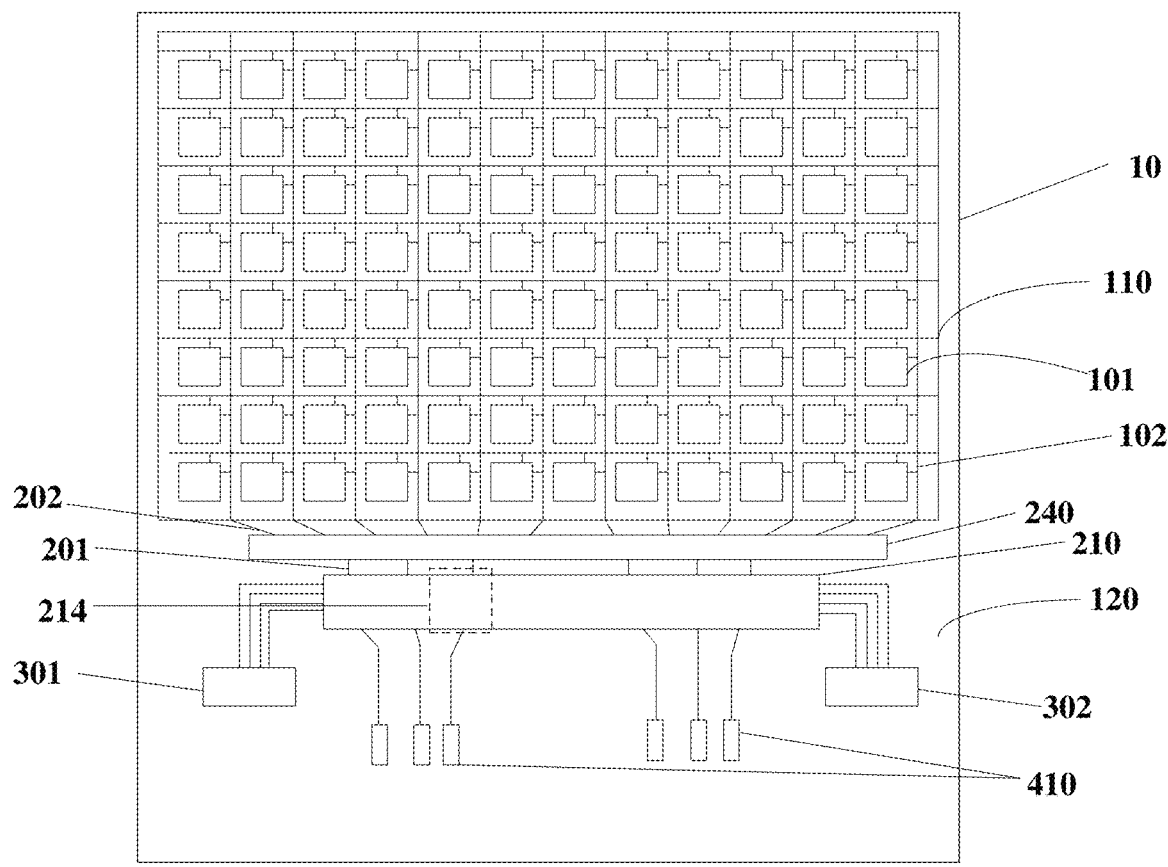
FIG. 1A is a schematic top view showing a display panel according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure found that a multiplexer in the related art are usually located on a side of a test circuit away from a display area, and are on the same plane as an integrated circuit. During the process of lighting up the display modules, the multiplexer need to be switched frequently. For example, the multiplexer need to switch once in a time such as 4.17 microseconds or 5.3 microseconds. The high frequency switching of the multiplexers generates electromagnetic radiation in space. Since the multiplexer is close to the integrated circuit, the electromagnetic radiation generated by the multiplexer due to their high-frequency switching will cause electromagnetic interference on the integrated circuit, thereby affecting the operation of the integrated circuit.

In view of this, embodiments of the present disclosure provide a display panel to reduce electromagnetic interference produced by the multiplexer on the integrated circuit.

Figure 2:
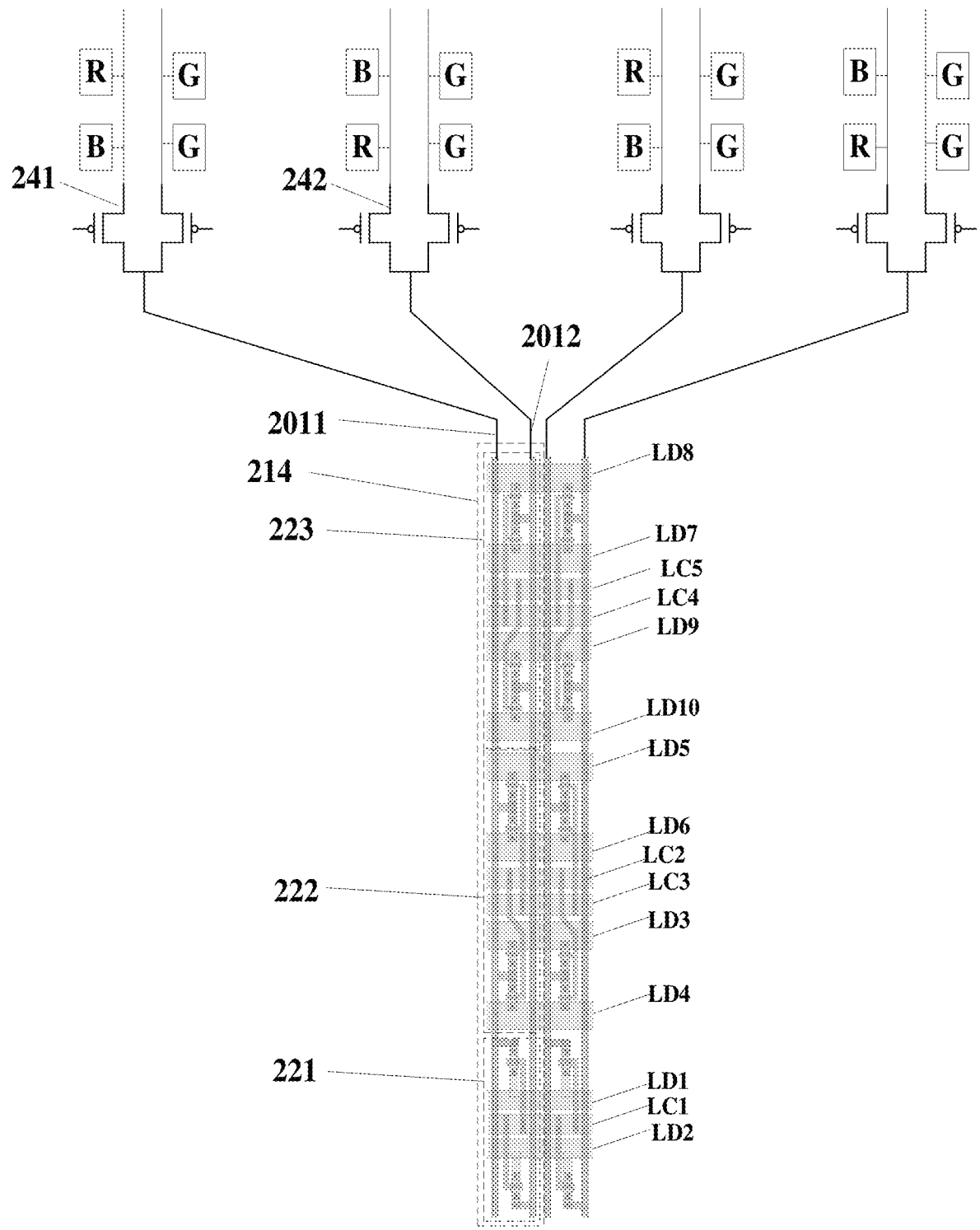
FIG. 2 is a top view showing a layout of a first test circuit according to an embodiment of the present disclosure.

FIG. 1A is a schematic top view showing a display panel according to an embodiment of the present disclosure. FIG. 2 is a top view showing a layout of a first test circuit according to an embodiment of the present disclosure.

As shown in FIG. 1A, the display panel comprises: a base substrate 10, a plurality of sub-pixels 101, a plurality of data signal lines 102, a plurality of signal transmission lines 202, a plurality of multiplexers 240, and a first test circuit 210. The base substrate 10 comprises a display area 110 and a peripheral area 120 on at least one side of the display area 110. The plurality of sub-pixels 101 are on a side of the base substrate and in the display area 110. The plurality of data signal lines 102 are in the display area 110 and are electrically connected to the plurality of sub-pixels 101. For example, the plurality of data signal lines 102 are electrically connected to multiple columns of sub-pixels 101 in one-to-one correspondence. The plurality of signal transmission lines 202 are in the peripheral area 120 and are electrically connected to the plurality of data signal lines 102. For example, the plurality of signal transmission lines 202 are electrically connected to the plurality of data signal lines 102 in one-to-one correspondence.

The plurality of multiplexers 240 are in the peripheral area and on a side of the plurality of signal transmission lines 202 away from the plurality of sub-pixels 101. At least one of the plurality of multiplexers 240 is electrically connected to at least two signal transmission lines 202.

As shown in FIG. 1A, the first test circuit 210 is in the peripheral area 120 and on a side of the plurality of multiplexers 240 away from the plurality of sub-pixels 101. The first test circuit 210 comprises a plurality of test components (for example, they may be referred to as first test components) 214. Each test component of at least a portion of the plurality of test components 214 is electrically connected to at least two of the plurality of multiplexers 240. For example, two adjacent multiplexers are electrically connected to one of the plurality of test components through two connection wires 201.

As shown in FIG. 2, each test component 214 comprises a first test sub-circuit 221, a second test sub-circuit 222 and a third test sub-circuit 223. The second test sub-circuit 222 is between the first test sub-circuit 221 and the third test sub-circuit 223. The first test sub-circuit 221 is on a side of the second test sub-circuit 222 away from the plurality of sub-pixels. For example, as shown in FIG. 2, an orthographic projection of the first test sub-circuit 221 on the base substrate is centrosymmetric.

Heretofore, a display panel according to some embodiments of the present disclosure is provided. In the display panel, the plurality of multiplexers are arranged between the first test circuit and the plurality of sub-pixels (or the display area). In this way, after bending the display panel, the multiplexers and the integrated circuit are on different planes, which can reduce electromagnetic interference produced by the multiplexers on the integrated circuit. Furthermore, the embodiment further provides the structure of the first test circuit. That is, the first test circuit comprises a plurality of test components. Each test component of at least a portion of the plurality of test components is electrically connected to at least two of the plurality of multiplexers. Each test component comprises a first test sub-circuit, a second test sub-circuit, and a third test sub-circuit. The second test sub-circuit is between the first test sub-circuit and the third test sub-circuit. The first test sub-circuit is on a side of the second test sub-circuit away from the plurality of sub-pixels.

In some embodiments, as shown in FIG. 1A, the display panel further comprises a first signal access terminal group 301 and a second signal access terminal group 302. The first signal access terminal group 301 is in the peripheral area 120. The first signal access terminal group 301 is on a side of the first test circuit 210 in an extending direction along a boundary between the display area and the peripheral area. For example, the first signal access terminal group 301 is electrically connected to the first test circuit 210 through lead wires. The first signal access terminal group 301 is configured to transmit test switch signals and data signals to the first test circuit 210. The second signal access terminal group 302 is in the peripheral area 120. The second signal access terminal group 302 is on a side of the first test circuit 210 away from the first signal access terminal group 301 in the extending direction along the boundary between the display area and the peripheral area. For example, the second signal access terminal group 302 is electrically connected to the first test circuit 210 through lead wires. The second signal access terminal group 302 is configured to transmit test switch signals and data signals to the first test circuit 210. This can realize the control of the first test circuit.

In some embodiments, as shown in FIG. 1A, the display panel further comprise a plurality of connection pad areas 410, such as bond pad areas. The plurality of connection pad areas 410 are electrically connected to a plurality of data transmission lines. Each connection pad area is configured to transmit driving signals, such as data signals, to a plurality of sub-pixels.

In some embodiments, every two multiplexers are electrically connected to one test component 214 through two connection wires 201. For example, as shown in FIG. 2, the two connection wires 201 comprises a first connection wire 2011 and a second connection wire 2012. For example, as shown in FIG. 2, the plurality of multiplexers 240 comprises a first multiplexer 241 and a second multiplexer 242. The first multiplexer 241 is electrically connected to the test component 214 through the first connection wire 2011, and the second multiplexer 242 is electrically connected to the test component 214 through the second connection wire 2012. In this case, each test component 214 is electrically connected to at least four signal transmission lines 202.

Figure 1B:
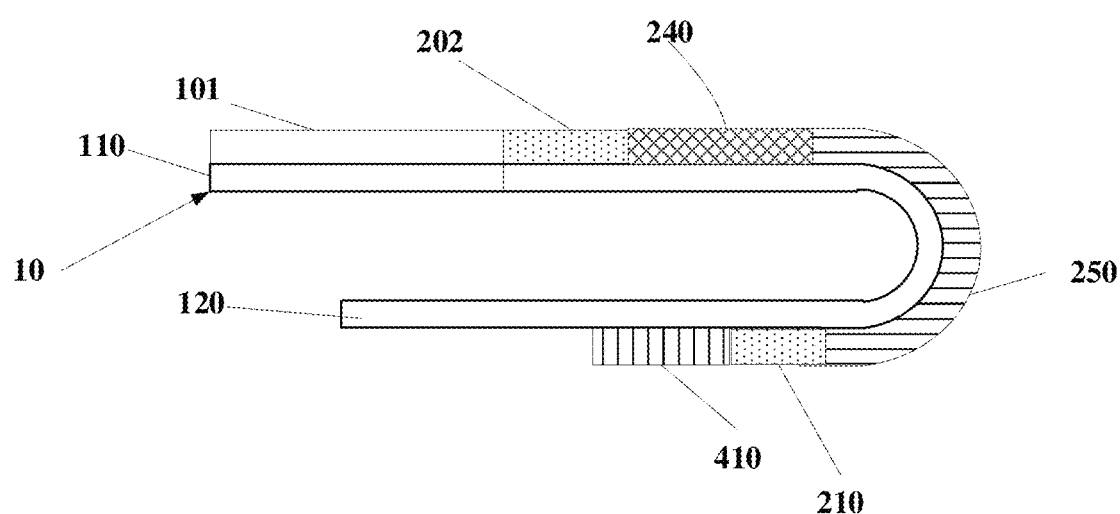
FIG. 1B is a schematic cross-sectional view showing a display panel according to an embodiment of the present disclosure.

FIG. 1B is a schematic cross-sectional view showing a display panel according to an embodiment of the present disclosure. In addition to the base substrate 10, the sub-pixel 101, the signal transmission line 202, the multiplexer 240, the first test circuit 210, and the connection pad area 410, a bending area 250 is also shown in FIG. 1B. It can be seen from FIG. 1B that after bending the display panel, the multiplexer 240 and the connection pad area 410 are on different planes. The connection pad area 410 may be electrically connected to an integrated circuit. Therefore, the above design may reduce electromagnetic interference produced by the multiplexer on the integrated circuit.

In some embodiments, as shown in FIG. 2, the first multiplexer 241 is electrically connected to two columns of sub-pixels. The second multiplexer 242 is electrically connected to other two columns of sub-pixels. As shown in FIG. 2, in the two columns of sub-pixels electrically connected to a multiplexer, one column of sub-pixels comprise red sub-pixels R and blue sub-pixels B that are alternately arranged, and the other column of sub-pixels comprises only green sub-pixels G.

Figure 3:
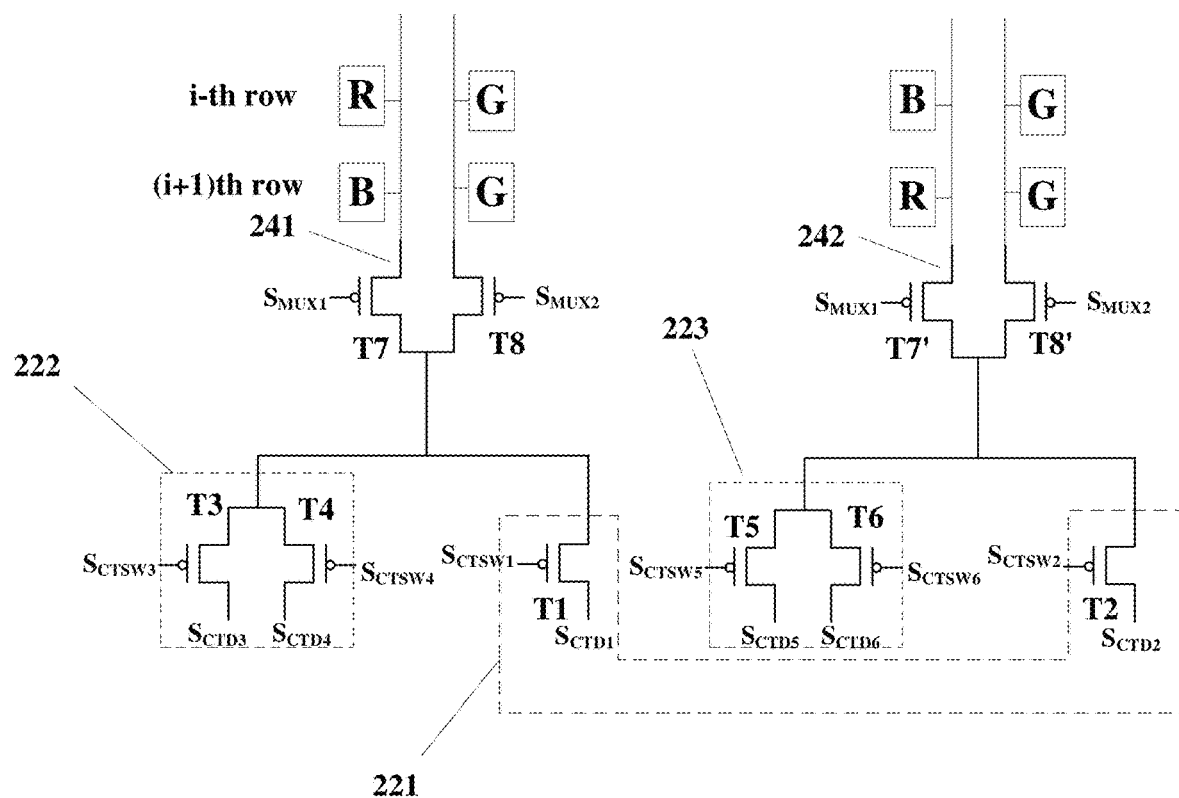
FIG. 3 is a circuit connection diagram showing a first test circuit and a multiplexer according to an embodiment of the present disclosure.

FIG. 3 is a circuit connection diagram showing a first test circuit and a multiplexer according to an embodiment of the present disclosure.

As shown in FIG. 3, the first test sub-circuit 221 comprises a first transistor T1 and a second transistor T2. A first electrode of the first transistor T1 is configured to receive a first data signal $S_{CTD1}$. A second electrode of the first transistor T1 is electrically connected to an input terminal of the first multiplexer 241. A control electrode of the first transistor T1 is configured to receive a first test switch signal $S_{CTSW1}$. A first electrode of the second transistor T2 is configured to receive a second data signal $S_{CTD2}$. A second electrode of the second transistor T2 is electrically connected to an input terminal of the second multiplexer 242. A control electrode of the second transistor T2 is configured to receive a second test switch signal $S_{CTSW2}$.

As shown in FIG. 3, the second test sub-circuit 222 comprises a third transistor T3 and a fourth transistor T4. A first electrode of the third transistor T3 is configured to receive a third data signal $S_{CTD3}$. A second electrode of the third transistor T3 is electrically connected to the input terminal of the first multiplexer 241. A control electrode of the third transistor T3 is configured to receive a third test switch signal $S_{CTSW3}$. A first electrode of the fourth transistor T4 is configured to receive a fourth data signal $S_{CTD4}$. A second electrode of the fourth transistor T4 is electrically connected to the input terminal of the first multiplexer 241. A control electrode of the fourth transistor T4 is configured to receive a fourth test switch signal $S_{CTSW4}$.

The third test sub-circuit 223 comprises a fifth transistor T5 and a sixth transistor T6. A first electrode of the fifth transistor T5 is configured to receive a fifth data signal $S_{CTD5}$. A second electrode of the fifth transistor T5 is electrically connected to the input terminal of the second multiplexer 242. A control electrode of the fifth transistor T5 is configured to receive a fifth test switch signal $S_{CTSW5}$. A first electrode of the sixth transistor T6 is configured to receive a sixth data signal $S_{CTD6}$. A second electrode of the sixth transistor T6 is electrically connected to the input terminal of the second multiplexer 242. A control electrode of the sixth transistor T6 is configured to receive a sixth test switch signal $S_{CTSW6}$.

In some embodiments, the fifth test switch signal $S_{CTSW5}$ is the same as the third test switch signal $S_{CTSW3}$, and the sixth test switch signal $S_{CTSW6}$ is the same as the fourth test switch signal $S_{CTSW4}$.

As shown in FIG. 3, each multiplexer comprises a seventh transistor and an eighth transistor. For example, the first multiplexer 241 comprises a seventh transistor T7 and an eighth transistor T8, and the second multiplexer 242 comprises a seventh transistor T7' and an eighth transistor T8'.

The following description will be given with the first multiplexer 241 as an example. The seventh transistor T7 and the eighth transistor T8 share a first electrode serving as the input terminal of the multiplexer. A second electrode of the seventh transistor T7 is electrically connected to one of the at least two signal transmission lines. For example, the one of the at least two signal transmission lines is electrically connected to a column of sub-pixels in which red sub-pixels R and blue sub-pixels B are alternately arranged. A control electrode of the seventh transistor T7 is configured to receive a first selection signal $S_{MUX1}$. A second electrode of the eighth transistor T8 is electrically connected to another of the at least two signal transmission lines. For example, the another of the at least two signal transmission lines is electrically connected to a column of green sub-pixels G. A control electrode of the eighth transistor T8 is configured to receive a second selection signal $S_{MUX2}$.

In some embodiments, as shown in FIG. 3, the first to eighth transistors are all PMOS (positive channel Metal Oxide Semiconductor) transistors. Of course, the scope of the embodiments of the present disclosure is not limited to this. For example, the first to the eighth transistors may also be NMOS (Negative channel Metal Oxide Semiconductor) transistors.

In the embodiments of the present disclosure, with the test switch signals, data signals, and selection signals described above, the various test sub-circuits and multiplexers can be controlled to implement a display test of the display panel.

Figure 4:
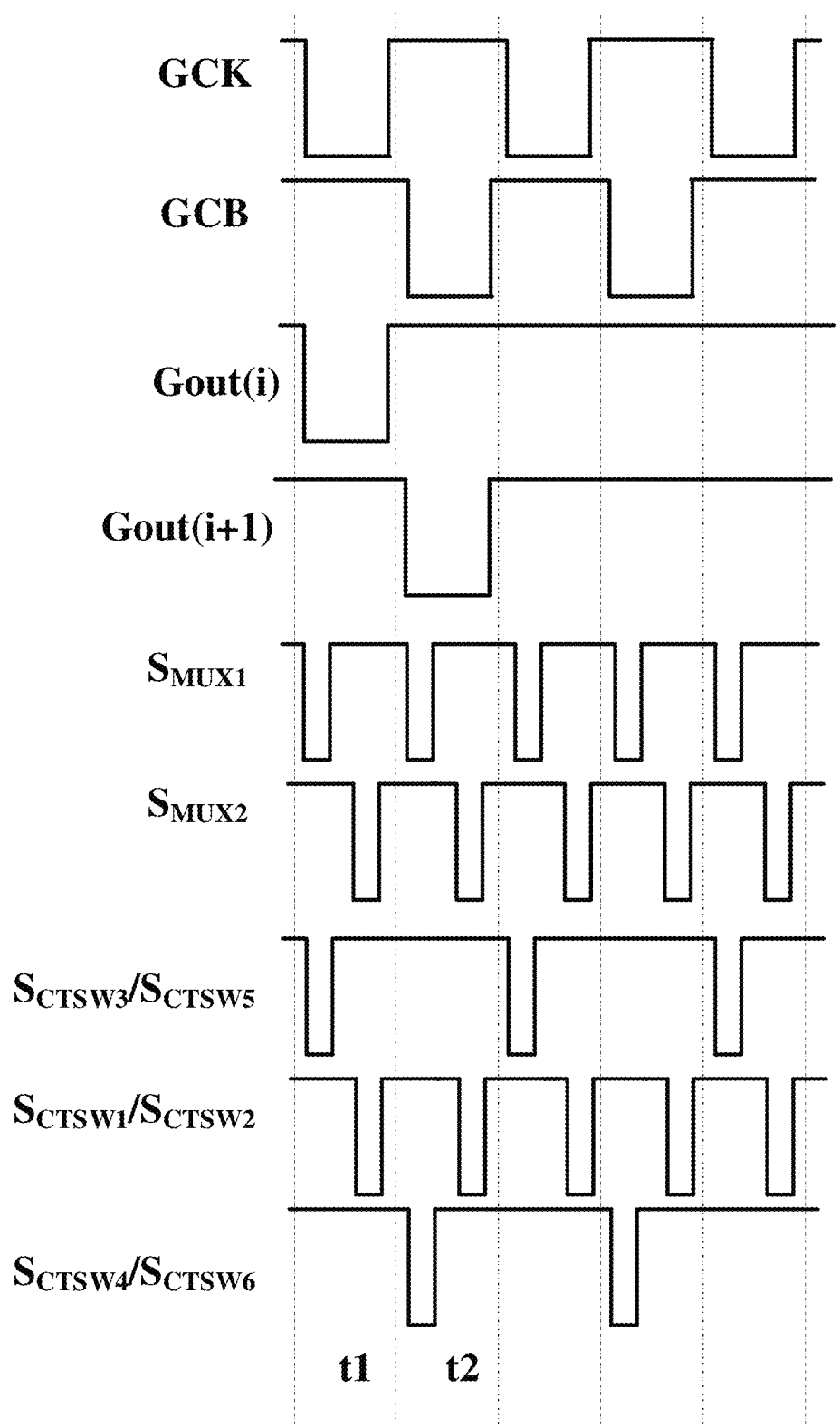
FIG. 4 is a timing diagram showing switch signals according to some embodiments of the present disclosure.

FIG. 4 is a timing diagram showing switch signals according to some embodiments of the present disclosure. A testing process of the display panel according to some embodiments of the present disclosure will be described in detail below in conjunction with FIG. 3 and FIG. 4.

It should be noted that the GCK signal and the GCB signal are clock control signals of a gate driving circuit. The GCK, GCB, and other signals are input to the gate driving circuit, so that the gate driving circuit outputs a gate control signal Gout(i) or Gout(i+1), wherein i is a positive integer. In this way, the gate driving circuit drives a pixel driving circuit of the sub-pixel in row scanning. These signals are known to those skilled in the art and will not be described in detail here.

Here, the description will be given with an example in which the first to eighth transistors are PMOS transistors.

For example, in the case where a red screen needs to be displayed on the display panel for testing, the following method can be performed.

As shown in FIG. 4, in a first stage t1, the Gout(i) signal is at a low level, which enables the gate driving circuit in the i-th row; and the Gout(i+1) signal is at a high level, which disables the gate driving circuit in the (i+1)th row. Here, i is a positive integer.

For example, in the first half of the first stage t1, the seventh transistors T7 and T7' are turned on when the first selection signal $S_{MUX1}$ is at a low level. At this moment, the third test switch signal $S_{CTSW3}$ and the fifth test switch signal $S_{CTSW5}$ are both at a low level, resulting in that the third transistor T3 and the fifth transistor T5 are also turned on. In this way, the third data signal SCTD3 can be input to the red sub-pixels R in the i-th row, and the fifth data signal $S_{CTD5}$ can be input to the blue sub-pixels B in the i-th row. In the process of displaying a red screen as needed, the third data signal $S_{CTD3}$ is a data signal that makes the red sub-pixels emit light, and the fifth data signal $S_{CTD5}$ is a data signal that cannot make the blue sub-pixels emit light. In this way, the red sub-pixels in the i-th row emit light, while the blue sub-pixels in the i-th row do not emit light.

Next, in the second half of the first stage t1, all the first selection signal $S_{MUX1}$, the third test switch signal $S_{CTSW3}$, and the fifth test switch signal $S_{CTSW5}$ change from a low level to a high level, resulting in that all the seventh transistors T7 and T7', the third transistor T3 and the fifth transistor T5 are turned off. The second selection signal $S_{MUX2}$ changes from a high level to a low level, causing that the eighth transistors T8 and T8' are turned on. At this moment, both the first test switch signal $S_{CTSW1}$ and the second test switch signal $S_{CTSW2}$ change to a low level, causing that both the first transistor T1 and the second transistor T2 are turned on. Thus, the first data signal $S_{CTD1}$ and the second data signal $S_{CTD2}$ are input to the green sub-pixels G in the i-th row. However, in the process of displaying a red screen as needed, both the first data signal $S_{CTD1}$ and the second data signal $S_{CTD2}$ are data signals that cannot cause the green sub-pixels to emit light, so that the green sub-pixels in the i-th row do not emit light.

Next, as shown in FIG. 4, in a second stage t2, the Gout(i) signal changes from a low level to a high level, causing that the gate driving circuit in the i-th row is disabled. The Gout(i+1) signal changes from a high level to a low level, causing that the gate driving circuit in the (i+1)th row is enabled.

For example, in the first half of the second stage t2, the seventh transistors T7 and T7' are turned on when the first selection signal $S_{MUX1}$ is at a low level. At this moment, the fourth test switch signal $S_{CTSW4}$ and the sixth test switch signal $S_{CTSW6}$ are both at a low level, causing that the fourth transistor T4 and the sixth transistor T6 are turned on. Thus, the fourth data signal $S_{CTD4}$ is input to the blue sub-pixels B in the (i+1)th row, and the sixth data signal $S_{CTD6}$ is input to the red sub-pixels R in the (i+1)th row. In the process of displaying a red screen as needed, the fourth data signal $S_{CTD4}$ is a data signal that cannot make the blue sub-pixels emit light, and the sixth data signal $S_{CTD6}$ is a data signal that makes the red sub-pixels emit light. In this way, the red sub-pixels in the (i+1)th row emit light, while the blue sub-pixels in the (i+1)th row do not emit light.

Next, in the second half of the second stage t2, all the first selection signal $S_{MUX1}$, the fourth test switch signal $S_{CTSW4}$, and the sixth test switch signal $S_{CTSW6}$ change from a low level to a high level, resulting in that all the seventh transistors T7 and T7', the fourth transistor T4 and the sixth transistor T6 are turned off. The second selection signal $S_{MUX2}$ changes from a high level to a low level, causing that the eighth transistors T8 and T8' are turned on. At this moment, both the first test switch signal $S_{CTSW1}$ and the second test switch signal $S_{CTSW2}$ change to a low level, causing that both the first transistor T1 and the second transistor T2 are turned on. Thus, the first data signal $S_{CTD1}$ and the second data signal $S_{CTD2}$ are input to the green sub-pixels G in the (i+1)th row. However, in the process of displaying a red screen as needed, both the first data signal $S_{CTD1}$ and the second data signal $S_{CTD2}$ are data signals that cannot cause the green sub-pixels to emit light, so that the green sub-pixels in the (i+1)th row do not emit light.

Heretofore, the process of testing the red screen on the display panel has been described. In the process of displaying the red screen as needed, all the red sub-pixels of the display panel are inputted with data signals that make the red sub-pixels emit light. Although the blue sub-pixels and the green sub-pixels are also input with corresponding data signals, these data signals cannot make the blue sub-pixels and the green sub-pixels emit light, so that the red screen can be displayed during the test.

In other embodiments, when a blue screen needs to be displayed on the display panel for testing, a method similar to the above method can be performed. The difference is that: in the process of displaying a blue screen as needed, the data signals (comprising the fourth data signal $S_{CTD4}$ and the fifth data signal $S_{CTD5}$) input to all the blue sub-pixels are signals that can make the blue sub-pixels emit light, the data signals (comprising the third data signal $S_{CTD3}$ and the sixth data signal $S_{CTD6}$) input to the red sub-pixels are data signals that cannot make the red sub-pixels emit light, and the data signals (comprising the first data signal $S_{CTD1}$ and the second data signal $S_{CTD2}$) input to the green sub-pixels are data signals that cannot make the green sub-pixels emit light. Therefore, the display panel can display the blue screen.

In other embodiments, in the process of displaying a green screen as needed, the data signals (comprising the first data signal $S_{CTD1}$ and the second data signal $S_{CTD2}$) input to all the green sub-pixels are signals that can make the green sub-pixels emit light, the data signals (comprising the third data signal $S_{CTD3}$ and the sixth data signal $S_{CTD6}$) input to the red sub-pixels are data signal that cannot make the red sub-pixels emit light, and the data signals (comprising the fourth data signal $S_{CTD4}$ and the fifth data signal $S_{CTD5}$) input to the blue sub-pixels are data signals that cannot make the blue sub-pixels emit light. Therefore, the display panel can display the green screen.

Heretofore, the test process of the display panel according to some embodiments of the present disclosure is realized. In this test process, each test component transmits a data signal to a multiplexer electrically connected to the test component under the control of a test switch signal; and the multiplexer transmits the data signal to corresponding sub-pixels under the control of a selection signal. This makes it easier to test the display panel.

Figure 5:
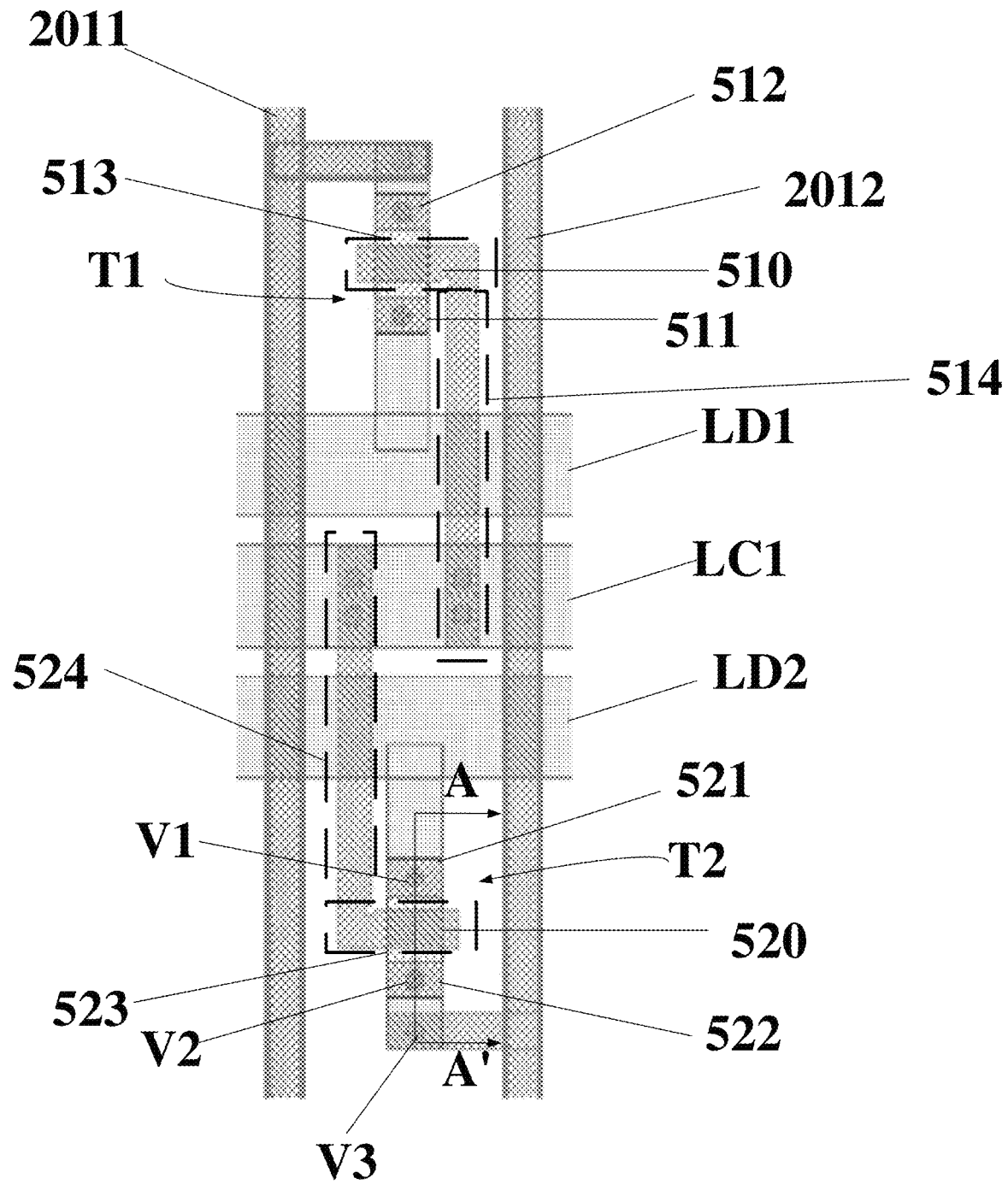
FIG. 5 is an enlarged schematic diagram showing a first test sub-circuit 221 in FIG. 2 according to an embodiment of the present disclosure.

FIG. 5 is an enlarged schematic diagram showing a first test sub-circuit 221 in FIG. 2 according to an embodiment of the present disclosure.

In some embodiments, an orthographic projection of the first test sub-circuit on the base substrate is centrosymmetric. This may reduce the layout space of the first test circuit.

In some embodiments, as shown in FIGS. 2 and 5, the display panel further comprises a first control line LC1, a first data line LD1, and a second data line LD2. The first control line LC1 is electrically connected to a control electrode 510 of the first transistor T1 and a control electrode 520 of the second transistor T2. For example, the first control line LC1 is electrically connected to the control electrode 510 of the first transistor T1 through a conductive via and a first connector 514; and the first control line LC1 is electrically connected to the control electrode 520 of the second transistor T2 through a conductive via and a second connector 524. The first control line LC1 is configured to transmit the first test switch signal $S_{CTSW1}$ and the second test switch signal $S_{CTSW2}$. The first test switch signal is the same as the second test switch signal. The first data line LD1 is electrically connected to a first electrode 511 of the first transistor T1. The first data line LD1 is configured to transmit the first data signal $S_{CTD1}$. The second data line LD2 is electrically connected to a first electrode 521 of the second transistor T2. The second data line LD2 is configured to transmit the second data signal $S_{CTD2}$. An orthographic projection of the first control line LC1 on the base substrate is between an orthographic projection of the first data line LD1 on the base substrate and an orthographic projection of the second data line LD2 on the base substrate. In addition, FIG. 5 also shows a first active layer 513 of the first transistor T1 and a second active layer 523 of the second transistor T2.

As shown in FIG. 5, a second electrode 512 of the first transistor T1 is electrically connected to the first connection wire 2011. The second electrode 512 of the first transistor T1 is electrically connected to the first connection wire 2011 through a conductive via. A second electrode 522 of the second transistor T2 is electrically connected to the second connection wire 2012. For example, the second electrode 522 of the second transistor T2 is electrically connected to the second connection wire 2012 through a conductive via (which will be described later).

In some embodiments, an orthographic projection of the control electrode 510 of the first transistor T1 on the base substrate is between an orthographic projection of the first electrode 511 of the first transistor T1 on the base substrate and an orthographic projection of the second electrode 512 of the first transistor T1 on the base substrate. An orthographic projection of the control electrode 520 of the second transistor T2 on the base substrate is between an orthographic projection of the first electrode 521 of the second transistor T2 on the base substrate and an orthographic projection of the second electrode 522 of the second transistor T2 on the base substrate. The orthographic projection of the first electrode 511 of the first transistor T1 on the base substrate and the orthographic projection of the first electrode 521 of the second transistor T2 on the base substrate are between the orthographic projection of the control electrode 510 of the first transistor T1 on the base substrate and the orthographic projection of the control electrode 520 of the second transistor T2 on the base substrate.

Heretofore, the layout structure of the first test sub-circuit has been described.

Figure 6:
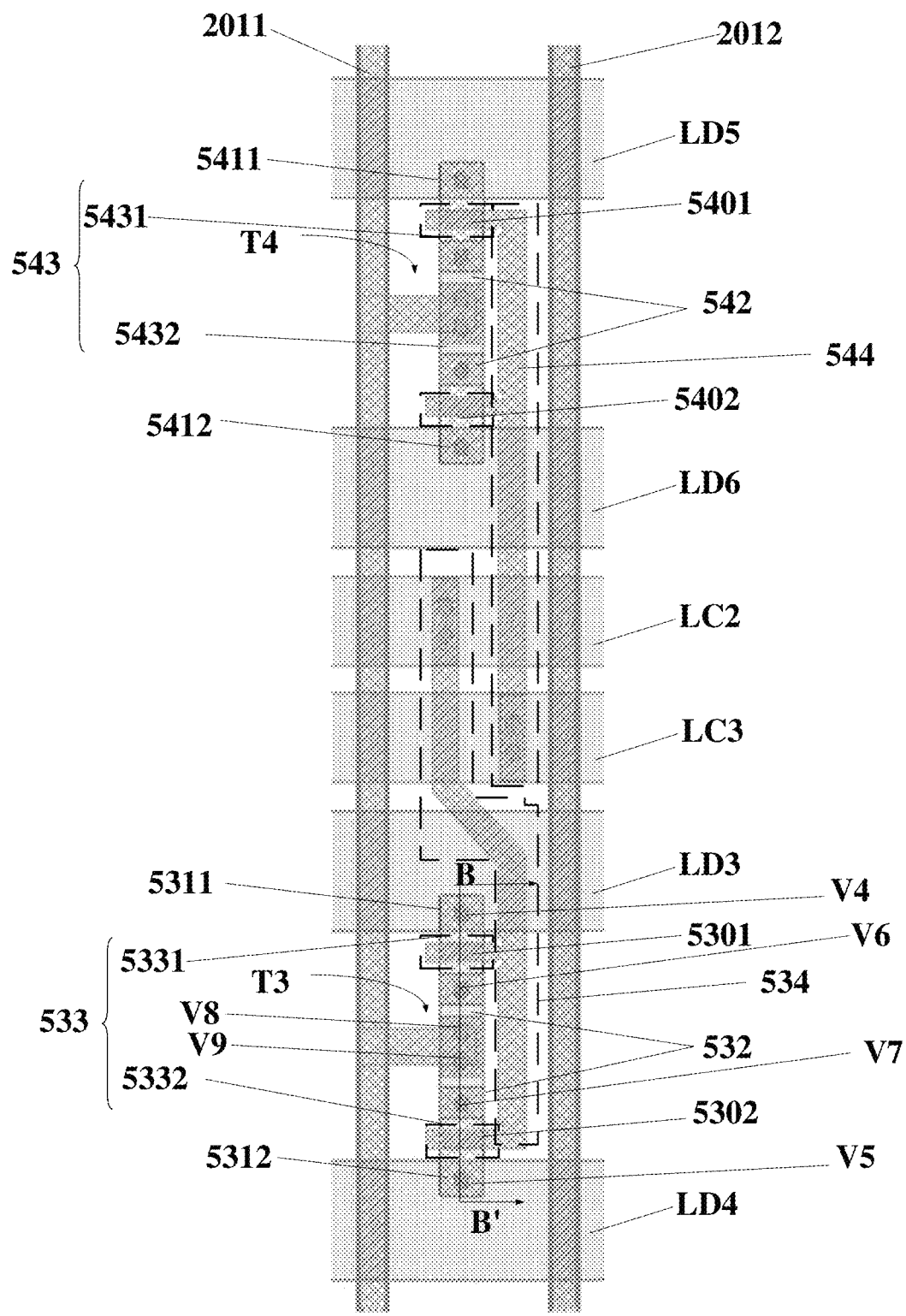
FIG. 6 is an enlarged schematic diagram showing a second test sub-circuit 222 in FIG. 2 according to an embodiment of the present disclosure.

FIG. 6 is an enlarged schematic diagram showing a second test sub-circuit 222 in FIG. 2 according to an embodiment of the present disclosure.

In some embodiments, as shown in FIG. 6, the third transistor T3 comprises two first electrodes 5311 and 5312, one second electrode 532, and two control electrodes 5301 and 5302. The fourth transistor T4 comprises two first electrodes 5411 and 5412, one second electrode 542, and two control electrodes 5401 and 5402. In addition, FIG. 6 also shows a third active layer 533 of the third transistor T3 and a fourth active layer 543 of the fourth transistor T4. For example, the third active layer 533 comprises a first sub-active layer 5331 and a second sub-active layer 5332, and the fourth active layer 543 comprises a third sub-active layer 5431 and a fourth sub-active layer 5432.

In some embodiments, as shown in FIG. 6, the display panel further comprises a second control line LC2, a third data line LD3, a fourth data line LD4, a third control line LC3, a fifth data line LDS, and a sixth data line LD6.

The second control line LC2 is electrically connected to the two control electrodes 5301 and 5302 of the third transistor T3. For example, the second control line LC2 is electrically connected to the two control electrodes 5301 and 5302 of the third transistor T3 through a third connector 534 and a conductive via. The second control line LC2 is configured to transmit the third test switch signal $S_{CTSW3}$.

The third data line LD3 is electrically connected to one first electrode 5311 of the two first electrodes of the third transistor T3. The third data line LD3 is configured to transmit the third data signal $S_{CTD3}$.

The fourth data line LD4 is electrically connected to the other first electrode 5312 of the two first electrodes of the third transistor T3. The fourth data line LD4 is configured to transmit the third data signal $S_{CTD3}$.

The third control line LC3 is electrically connected to the two control electrodes 5401 and 5402 of the fourth transistor T4. For example, the third control line LC3 is electrically connected to the two control electrodes 5401 and 5402 of the fourth transistor T4 through a fourth connector 544 and a conductive via. The third control line LC3 is configured to transmit the fourth test switch signal $S_{CTSW4}$.

The fifth data line LD5 is electrically connected to one first electrode 5411 of the two first electrodes of the fourth transistor T4. The fifth data line LD5 is configured to transmit the fourth data signal $S_{CTD4}$.

The sixth data line LD6 is electrically connected to the other first electrode 5412 of the two first electrodes of the fourth transistor T4. The sixth data line LD6 is configured to transmit the fourth data signal $S_{CTD4}$.

In some embodiments, an orthographic projection of the second control line LC2 on the base substrate is between an orthographic projection of the third control line LC3 on the base substrate and an orthographic projection of the sixth data line LD6 on the base substrate. The orthographic projection of the third control line LC3 on the base substrate is between the orthographic projection of the second control line LC2 on the base substrate and an orthographic projection of the third data line LD3 on the base substrate. The orthographic projection of the third data line LD3 on the base substrate and the orthographic projection of the sixth data line LD6 on the base substrate are between an orthographic projection of the third transistor T3 on the base substrate and an orthographic projection of the fourth transistor T4 on the base substrate.

As shown in FIG. 6, the second electrode 532 of the third transistor T3 and the second electrode 542 of the fourth transistor T4 are both electrically connected to the first connection wire 2011. For example, the second electrode 532 of the third transistor T3 and the second electrode 542 of the fourth transistor T4 are electrically connected to the first connection wire 2011 through conductive vias (which will be described later), respectively.

In some embodiments, an orthographic projection of one control electrode 5301 of the two control electrodes of the third transistor T3 on the base substrate is between an orthographic projection of one first electrode 5311 of the two first electrodes of the third transistor T3 on the base substrate and an orthographic projection of the second electrode 532 of the third transistor T3 on the base substrate. An orthographic projection of the other control electrode 5302 of the two control electrodes of the third transistor T3 on the base substrate is between an orthographic projection of the other first electrode 5312 of the two first electrodes of the third transistor T3 on the base substrate and the orthographic projection of the second electrode 532 of the third transistor T3 on the base substrate.

In some embodiments, an orthographic projection of one control electrode 5401 of the two control electrodes of the fourth transistor T4 on the base substrate is between an orthographic projection of one first electrode 5411 of the two first electrodes of the fourth transistor T4 on the base substrate and an orthographic projection of the second electrode 542 of the fourth transistor T4 on the base substrate. An orthographic projection of the other control electrode 5402 of the two control electrodes of the fourth transistor T4 on the base substrate is between an orthographic projection of the other first electrode 5412 of the two first electrodes of the fourth transistor T4 on the base substrate and the orthographic projection of the second electrode 542 of the fourth transistor T4 on the base substrate.

Figure 7:
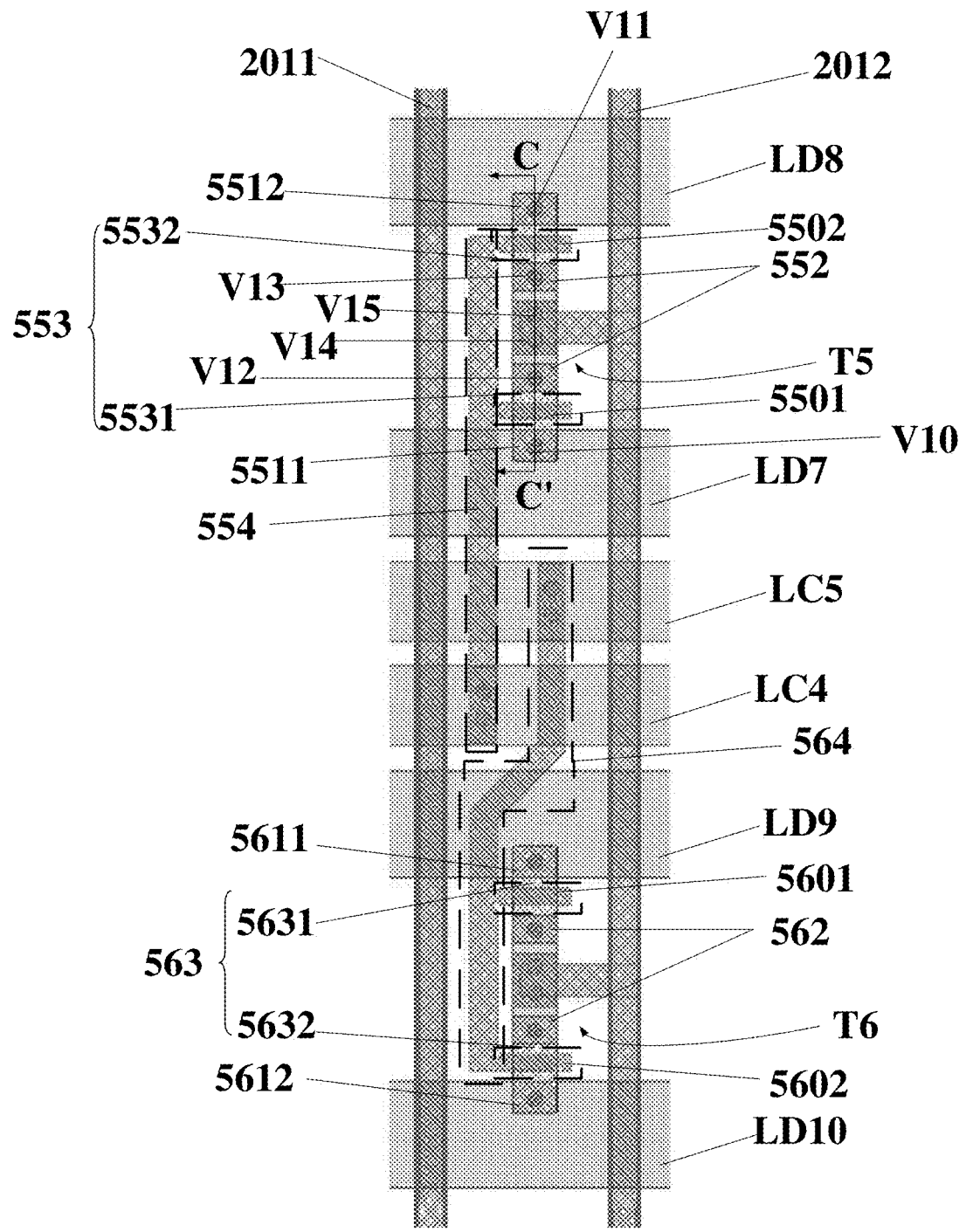
FIG. 7 is an enlarged schematic diagram showing a third test sub-circuit 223 in FIG. 2 according to an embodiment of the present disclosure.

FIG. 7 is an enlarged schematic diagram showing a third test sub-circuit 223 in FIG. 2 according to an embodiment of the present disclosure.

In some embodiments, as shown in FIG. 7, the fifth transistor T5 comprises two first electrodes 5511 and 5512, one second electrode 552, and two control electrodes 5501 and 5502. The sixth transistor T6 comprises two first electrodes 5611 and 5612, one second electrode 562, and two control electrodes 5601 and 5602. In addition, FIG. 7 further shows a fifth active layer 553 of the fifth transistor T5 and a sixth active layer 563 of the sixth transistor T6. For example, the fifth active layer 553 comprises a fifth sub-active layer 5531 and a sixth sub-active layer 5532; and the sixth active layer 563 comprises a seventh sub-active layer 5631 and an eighth sub-active layer 5632.

In some embodiments, as shown in FIG. 7, the display panel further comprises a fourth control line LC4, a seventh data line LD7, an eighth data line LD8, a fifth control line LC5, a ninth data line LD9, and a tenth data line LD10.

The fourth control line LC4 is electrically connected to the two control electrodes 5501 and 5502 of the fifth transistor T5. For example, the fourth control line LC4 is electrically connected to the two control electrodes 5501 and 5502 of the fifth transistor T5 through a fifth connector 554 and a conductive via. The fourth control line LC4 is configured to transmit the fifth test switch signal $S_{CTSW5}$.

The seventh data line LD7 is electrically connected to one first electrode 5511 of the two first electrodes of the fifth transistor T5. The seventh data line LD7 is configured to transmit the fifth data signal $S_{CTD5}$.

The eighth data line LD8 is electrically connected to the other first electrode 5512 of the two first electrodes of the fifth transistor T5. The eighth data line LD8 is configured to transmit the fifth data signal $S_{CTD5}$.

The fifth control line LC5 is electrically connected to the two control electrodes 5601 and 5602 of the sixth transistor T6. For example, the fifth control line LC5 is electrically connected to the two control electrodes 5601 and 5602 of the sixth transistor T6 through a sixth connector 564 and a conductive via. The fifth control line LC5 is configured to transmit the sixth test switch signal $S_{CTSW6}$.

The ninth data line LD9 is electrically connected to one first electrode 5611 of the two first electrodes of the sixth transistor T6. The ninth data line LD9 is configured to transmit the sixth data signal $S_{CTD6}$.

The tenth data line LD10 is electrically connected to the other first electrode 5612 of the two first electrodes of the sixth transistor T6. The tenth data line LD10 is configured to transmit the sixth data signal $S_{CTD6}$.

In some embodiments, an orthographic projection of the fourth control line LC4 on the base substrate is between an orthographic projection of the fifth control line LC5 on the base substrate and an orthographic projection of the ninth data line LD9 on the base substrate. The orthographic projection of the fifth control line LC5 on the base substrate is between the orthographic projection of the fourth control line LC4 on the base substrate and an orthographic projection of the seventh data line LD7 on the base substrate. The orthographic projection of the seventh data line LD7 on the base substrate and the orthographic projection of the ninth data line LD9 on the base substrate are between an orthographic projection of the fifth transistor T5 on the base substrate and an orthographic projection of the sixth transistor T6 on the base substrate.

In some embodiments, as shown in FIG. 7, the second electrode 552 of the fifth transistor T5 and the second electrode 562 of the sixth transistor T6 are both electrically connected to the second connection wire 2012. For example, the second electrode 552 of the fifth transistor T5 and the second electrode 562 of the sixth transistor T6 are electrically connected to the second connection wire 2012 through conductive vias (which will be described later), respectively.

In some embodiments, an orthographic projection of one control electrode 5501 of the two control electrodes of the fifth transistor T5 on the base substrate is between an orthographic projection of one first electrode 5511 of the two first electrodes of the fifth transistor T5 on the base substrate and an orthographic projection of the second electrode 552 of the fifth transistor T5 on the base substrate. An orthographic projection of the other control electrode 5502 of the two control electrodes of the fifth transistor T5 on the base substrate is between an orthographic projection of the other first electrode 5512 of the two first electrodes of the fifth transistor T5 on the base substrate and the orthographic projection of the second electrode 552 of the fifth transistor T5 on the base substrate.

In some embodiments, an orthographic projection of one control electrode 5601 of the two control electrodes of the sixth transistor T6 on the base substrate is between an orthographic projection of one first electrode 5611 of the two first electrodes of the sixth transistor T6 on the base substrate and an orthographic projection of the second electrode 562 of the sixth transistor T6 on the base substrate. An orthographic projection of the other control electrode 5602 of the two control electrodes of the sixth transistor T6 on the base substrate is between an orthographic projection of the other first electrode 5612 of the two first electrodes of the sixth transistor T6 on the base substrate and the orthographic projection of the second electrode 562 of the sixth transistor T6 on the base substrate.

Heretofore, the layout diagram of the first transistor T1 to the sixth transistor T6 according to some embodiments of the present disclosure has been described. However, those skilled in the art can understand that the above layout diagram is only exemplary, and the scope of the embodiments of the present disclosure is not limited to this. For example, in the layout diagram, the positions of the third transistor T3 and the fourth transistor T4 can be interchanged, and the positions of the fifth transistor T5 and the sixth transistor T6 can also be interchanged.

Figure 8:
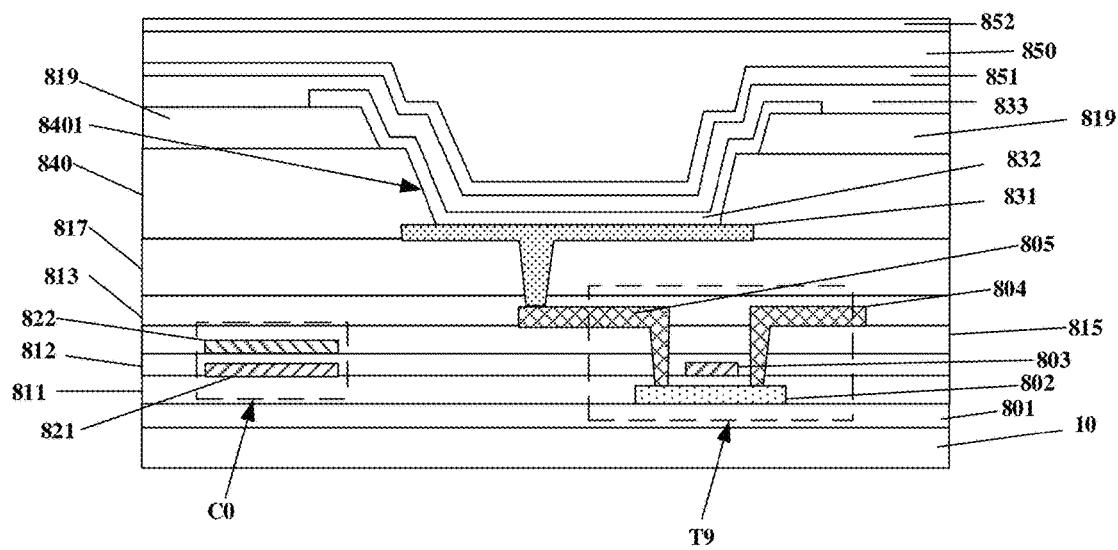
FIG. 8 is a schematic cross-sectional view showing a sub-pixel according to an embodiment of the present disclosure.

FIG. 8 is a schematic cross-sectional view showing a sub-pixel according to an embodiment of the present disclosure. As shown in FIG. 8, at least one sub-pixel comprises a ninth transistor T9 and a capacitor C0.

As shown in FIG. 8, the ninth transistor T9 comprises an active layer (for example, it may be referred to as a seventh active layer) 802. For example, the active layer 802 is on a buffer layer 801. The buffer layer 801 is on the base substrate 10. For example, the active layer 802 comprises a semiconductor layer. For example, a material of the active layer 802 comprises at least one of polysilicon or amorphous silicon.

As shown in FIG. 8, the ninth transistor T9 further comprises a first insulating layer 811 covering the active layer 802. For example, the first insulating layer 811 is an inorganic insulating layer. For example, a material of the first insulating layer 811 comprises silicon dioxide, silicon nitride, or the like.

As shown in FIG. 8, the ninth transistor T9 further comprises a gate 803 on a side of the first insulating layer 811 away from the active layer 802. For example, a material of the gate 803 comprises metal such as molybdenum (Mo).

As shown in FIG. 8, the ninth transistor T9 further comprises a second insulating layer 812 covering the gate 803. For example, the second insulating layer 812 is an inorganic insulating layer. For example, a material of the second insulating layer 812 comprises silicon dioxide, silicon nitride, or the like.

As shown in FIG. 8, the ninth transistor T9 further comprises an interlayer insulating layer 815 on a side of the second insulating layer 812 away from the gate 803. For example, the interlayer insulating layer 815 is an inorganic insulating layer. For example, a material of the interlayer insulating layer 815 comprises silicon dioxide, silicon nitride, or the like.

As shown in FIG. 8, the ninth transistor T9 further comprises a source 804 and a drain 805 both on a side of the interlayer insulating layer 815 away from the second insulating layer 812. For example, materials of the source 804 and the drain 805 comprise at least one of titanium (Ti) or aluminum (Al). For example, the source 804 and the drain 805 each comprise a three-layer structure of Ti/Al/Ti. The source 804 and the drain 805 each are electrically connected to the active layer 802. For example, the source 804 is electrically connected to the active layer 802 through a conductive via passing through the first insulating layer 811, the second insulating layer 812, and the interlayer insulating layer 815; and the drain 805 is electrically connected to the active layer 802 through another conductive via passing through the first insulating layer 811, the second insulating layer 812, and the interlayer insulating layer 815.

Heretofore, the ninth transistor for the sub-pixel according to some embodiments of the present disclosure has been described.

In some embodiments, as shown in FIG. 8, the capacitor C0 comprises a first conductive layer 821 in the same layer as the gate 803. For example, a material of the first conductive layer 821 may be the same as the material of the gate 803. This can facilitate the manufacture of the display panel. The first conductive layer 821 is covered by the second insulating layer 812. As shown in FIG. 8, the capacitor C0 further comprises a second conductive layer 822 on a side of the second insulating layer 812 away from the first conductive layer 821. The second conductive layer 822 is covered by the interlayer insulating layer 815. For example, both a material of the first conductive layer 821 and a material of the second conductive layer 822 comprise metal such as molybdenum. The capacitor C0 can be used for storing data.

It should be noted that the "same layer" in this embodiment of the present disclosure may refer to film layers on the same structural layer. Alternatively, for example, film layers in the same layer may be a layer structure formed by using the same film forming process to form a film layer for forming a specific pattern, and then using the same mask to pattern the film layer through a single patterning process. Depending on the particular patterns, the single patterning process may comprise multiple exposure, development or etching processes, and the particular patterns in the formed layer structure may or may not be continuous. These particular patterns may also be at different heights or have different thicknesses.

For example, the first conductive layer 821 is in the same layer as the gate 803. The first conductive layer 821 and the gate 803 are both on the first insulating layer 811. For example, the first conductive layer 821 and the gate 803 can be formed in the same patterning process.

In some embodiments, as shown in FIG. 8, the sub-pixel further comprises a third insulating layer 813 covering the source 804 and the drain 805. For example, a material of the third insulating layer 813 comprises silicon dioxide, silicon nitride, or the like.

As shown in FIG. 8, the sub-pixel further comprises a planarization layer 817 on a side of the third insulating layer 813 away from the source 804 and the drain 805. For example, a material of the planarization layer 817 comprises an organic insulating material.

As shown in FIG. 8, the sub-pixel further comprises an anode layer 831 on a side of the planarization layer 817 away from the third insulating layer 813. The anode layer 831 is electrically connected to the source 804 or the drain 805. For example, the anode layer 831 is electrically connected to the drain 805 through a conductive via passing through the planarization layer 817 and the third insulating layer 813.

As shown in FIG. 8, the sub-pixel further comprises a pixel defining layer 840 on a side of the planarization layer 817 away from the third insulating layer 813 and having an opening 8401. The opening 8401 exposes at least a portion of the anode layer 831.

As shown in FIG. 8, the sub-pixel further comprises a functional layer 832 at least within the opening 8401 and connected to the anode layer 831. For example, the functional layer 832 comprises a light-emitting layer or the like.

As shown in FIG. 8, the sub-pixel may further comprises a spacer layer 819 on a side of the pixel defining layer 840 away from the planarization layer 817. For example, a material of the spacer layer 819 comprises an inorganic insulating material or an organic insulating material.

As shown in FIG. 8, the sub-pixel further comprises a cathode layer 833 on a side of the functional layer 832 away from the anode layer 831. The cathode layer 833 may cover the spacer layer 819 and the functional layer 832. In an embodiment of the present disclosure, a light emitting device comprises the anode layer 831, the functional layer 832, and the cathode layer 833.

In some embodiments, as shown in FIG. 8, the sub-pixel further comprises an encapsulation layer on a side of the cathode layer 833 away from the functional layer 832. For example, the encapsulation layer comprises a first inorganic encapsulation layer 851 covering the cathode layer, an organic encapsulation layer 850 on a side of the first inorganic encapsulation layer 851 away from the cathode layer 833, and a second inorganic encapsulation layer 852 on a side of the organic encapsulation layer 850 away from the first inorganic encapsulation layer 851.

Heretofore, the structure of the sub-pixel according to some embodiments of the present disclosure has been described.

In some embodiments, the first connection wire 2011 is in the same layer as the second conductive layer 822, and the second connection wire 2012 is in the same layer as the gate 803. In other embodiments, the first connection wire 2011 is in the same layer as the gate 803, and the second connection wire 2012 is in the same layer as the second conductive layer 822.

In some embodiments, the first control line LC1 to the fifth control line LC5 and the first data line LD1 to the tenth data line LD10 are all in the same layer as the source 804 or the drain 805.

In some embodiments, the control electrodes of the first transistor T1 to the sixth transistor T6 are in the same layer as the gate 803. The active layers of the first transistor T1 to the sixth transistor T6 are in the same layer as the active layer 802 of the ninth transistor T9. The first electrodes of the first transistor T1 to the sixth transistor T6 are all in the same layer as the source 804 or the drain 805. The second electrodes of the first transistor T1 to the sixth transistor T6 are all in the same layer as the source 804 or the drain 805.

Figure 9:
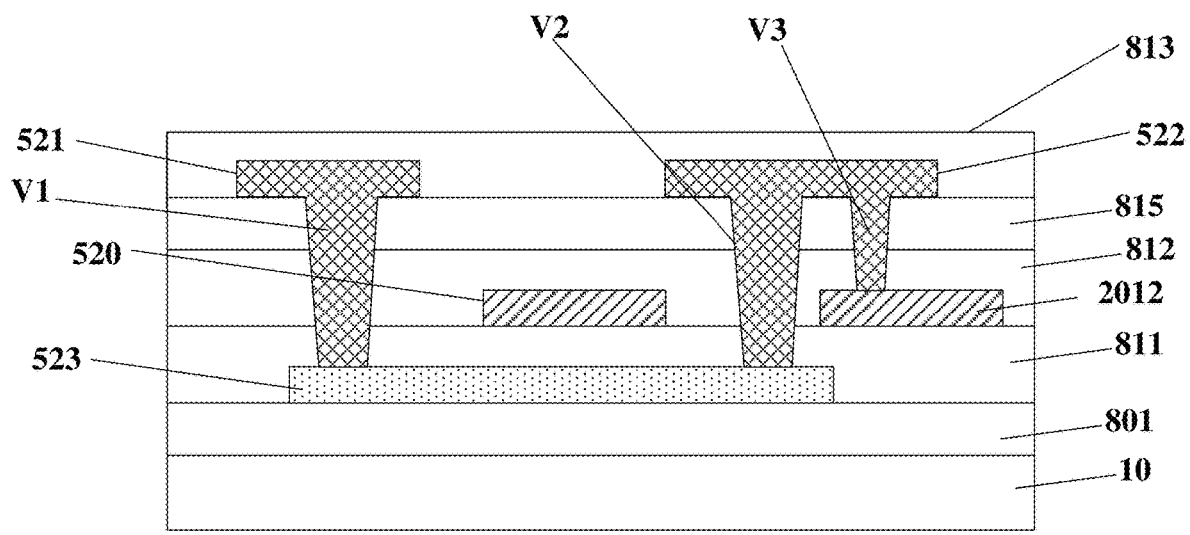
FIG. 9 is a cross-sectional view showing a structure of a first test sub-circuit taken along the line A-A' in FIG. 5 according to an embodiment of the present disclosure.

FIG. 9 is a cross-sectional view showing a structure of a first test sub-circuit taken along the line A-A' in FIG. 5 according to an embodiment of the present disclosure.

As shown in FIG. 9, the first electrode 521 and the second electrode 522 of the second transistor T2 are on the interlayer insulating layer 815. As shown in FIGS. 5 and 9, the first electrode 521 of the second transistor T2 is electrically connected to the second active layer 523 through a first conductive via V1. The second electrode 522 of the second transistor T2 is electrically connected to the second active layer 523 through a second conductive via V2. The second electrode 522 of the second transistor T2 is also electrically connected to the second connection wire 2012 through a third conductive via V3. For example, the control electrode 520 of the second transistor T2 is in the same layer as the second connection wire 2012.

The structure of the first transistor T1 is substantially similar to the structure of the second transistor T2, and will not be described in detail here. Compared with the structure of the second transistor T2, the structure of the first transistor T1 differs in that the second electrode 512 of the first transistor T1 is electrically connected to the first connection wire 2011 through a conductive via.

Figure 10:
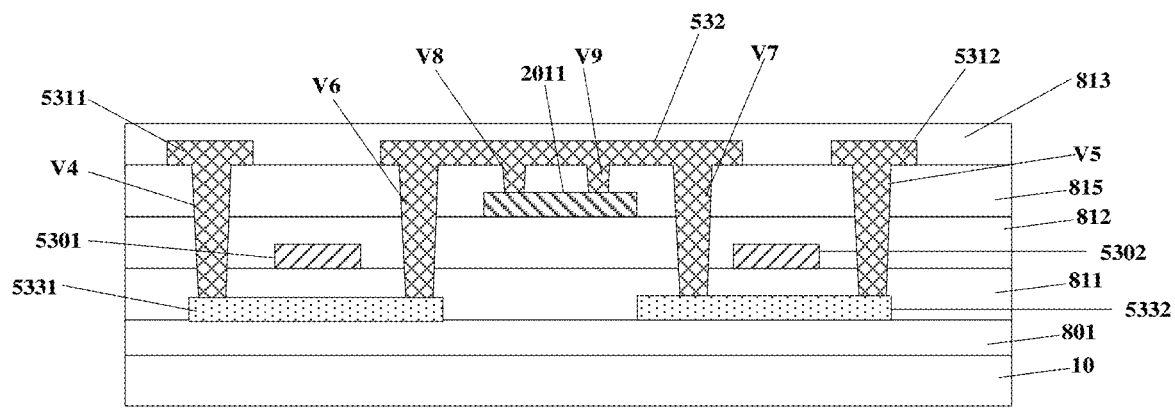
FIG. 10 is a cross-sectional view showing a structure of a second test sub-circuit taken along the line B-B' in FIG. 6 according to an embodiment of the present disclosure.

FIG. 10 is a cross-sectional view showing a structure of a second test sub-circuit taken along the line B-B' in FIG. 6 according to an embodiment of the present disclosure.

As shown in FIG. 10, two first electrodes 5311 and 5312 and one second electrode 532 of the third transistor T3 are on the interlayer insulating layer 815. As shown in FIGS. 6 and 10, one first electrode 5311 of the third transistor T3 is electrically connected to the first sub-active layer 5331 through a fourth conductive via V4. The other first electrode 5312 of the third transistor T3 is electrically connected to the second sub-active layer 5332 through a fifth conductive via V5. The second electrode 532 of the third transistor T3 is electrically connected to the first sub-active layer 5331 through a sixth conductive via V6. The second electrode 532 of the third transistor T3 is also electrically connected to the second sub-active layer 5332 through a seventh conductive via V7. The second electrode 532 of the third transistor T3 is also electrically connected to the first connection wire 2011 through an eighth conductive via V8 and a ninth conductive via V9. For example, the first connection wire 2011 is in the same layer as the second conductive layer 822.

The structure of the fourth transistor T4 is similar to the structure of the third transistor T3, and will not be described in detail here.

Figure 11:
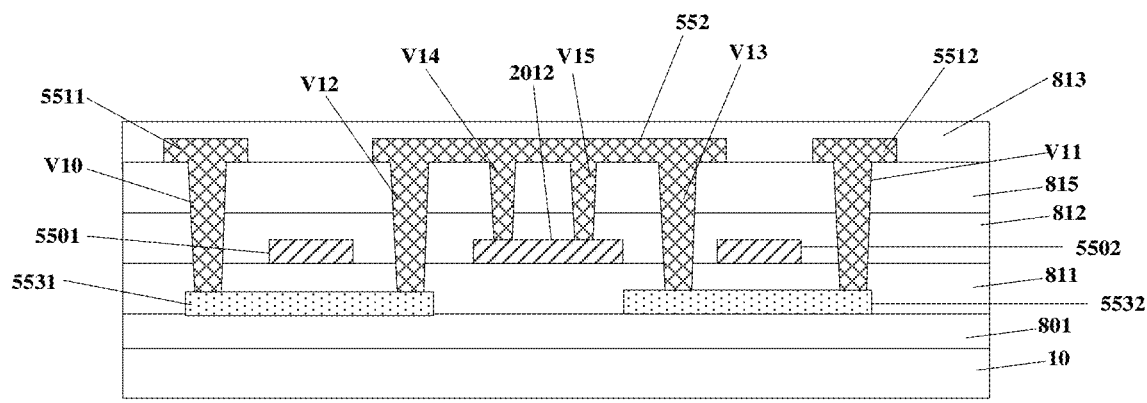
FIG. 11 is a cross-sectional view showing a structure of a third test sub-circuit taken along the line C-C' in FIG. 7 according to an embodiment of the present disclosure.

FIG. 11 is a cross-sectional view showing a structure of a third test sub-circuit taken along the line C-C' in FIG. 7 according to an embodiment of the present disclosure.

As shown in FIG. 11, two first electrodes 5511 and 5512 and one second electrode 552 of the fifth transistor T5 are on the interlayer insulating layer 815. As shown in FIGS. 7 and 11, one first electrode 5511 of the fifth transistor T5 is electrically connected to the fifth sub-active layer 5531 through a tenth conductive via V10. The other first electrode 5512 of the fifth transistor T5 is electrically connected to the sixth sub-active layer 5532 through an eleventh conductive via V11. The second electrode 552 of the fifth transistor T5 is electrically connected to the fifth sub-active layer 5531 through a twelfth conductive via V12. The second electrode 552 of the fifth transistor T5 is also electrically connected to the sixth sub-active layer 5532 through a thirteenth conductive via V13. The second electrode 552 of the fifth transistor T5 is also electrically connected to the second connection wire 2012 through a fourteenth conductive via V14 and a fifteenth conductive via V15. For example, the second connection wire 2012 is in the same layer as the gate 803.

The structure of the sixth transistor T6 is similar to the structure of the fifth transistor T5, and will not be described in detail here.

Figure 12:
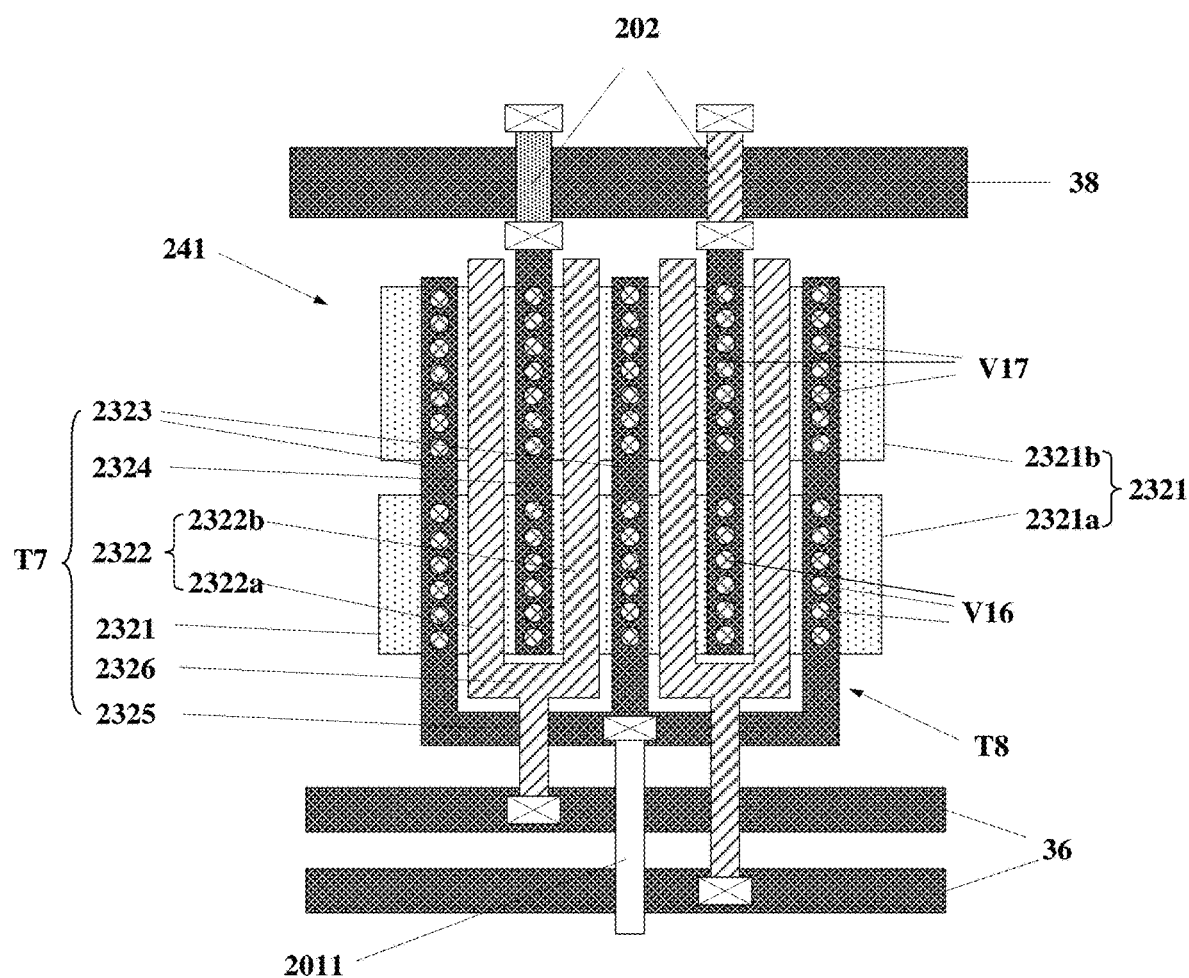
FIG. 12 is a schematic diagram showing a layout of a multiplexer according to an embodiment of the present disclosure.

FIG. 12 is a schematic diagram showing a layout of a multiplexer according to an embodiment of the present disclosure.

Here, the structure of the multiplexer will be described in conjunction with FIG. 12 with the first multiplexer 241 as an example. The seventh transistor T7 and the eighth transistor T8 are shown in FIG. 12. For example, the seventh transistor T7 (or the eighth transistor T8) comprises an active layer (it may be referred to as an eighth active layer) 2321, a gate 2322, two first electrodes 2323, and a second electrode 2324. In some embodiments, the seventh transistor T7 and the eighth transistor T8 share one first electrode 2323, which can reduce the space occupied by the multiplexer. This first electrode 2323 is electrically connected to the first connection wire 2011. In addition, the power bus 38 is also shown in FIG. 12.

The gate 2322 comprises a first gate portion 2322a and a second gate portion 2322b that are spaced apart from each other. The first gate portion 2322a and the second gate portion 2322b are electrically connected to one of a plurality of control signal lines 36.

The second electrode 2324 is electrically connected to one transmission line 202. An orthographic projection of the second electrode 2324 on the base substrate is between the orthographic projections of the two first electrodes 2323 on the base substrate. In some embodiments, the second electrode 2324 is in the same layer as the first electrodes 2323.

In some embodiments, as shown in FIG. 12, the seventh transistor T7 (or the eighth transistor T8) further comprises at least one of an electrode connection portion 2325 or a gate connection portion 2326. For example, the two first electrodes 2323 and the electrode connection portion 2325 are integrally provided. For example, the first gate portion 2322a, the second gate portion 2322b, and the gate connection portion 2326 are integrally provided.

An orthographic projection of the electrode connection portion 2325 on the base substrate is between an orthographic projection of the active layer 2321 on the base substrate and an orthographic projection of the plurality of control signal lines 36 on the base substrate. The two first electrodes 2323 are electrically connected to the first connection wire 2011 via the electrode connection portion 2325.

An orthographic projection of the gate connection portion 2326 on the base substrate is between an orthographic projection of the active layer 2321 on the base substrate and an orthographic projection of the electrode connection portion 2325 on the base substrate. The first gate portion 2322a and the second gate portion 2322b are electrically connected to one control signal line 36 via the gate connection portion 2326.

In the above embodiment, the seventh transistor T7 (or the eighth transistor T8) further comprises at least one of the electrode connection portion 2325 or the gate connection portion 2326. Such a structure facilitates the electrical connection between the first connection wire 2011 and the first electrode 2323, and the electrical connection between the control signal line 36 and the gate 2322.

In some embodiments, an orthographic projection of the first gate portion 2322a on the base substrate is between an orthographic projection of one of the two first electrodes 2323 on the base substrate and an orthographic projection of the second electrode 2324 on the base substrate, and an orthographic projection of the second gate portion 2322b on the base substrate is between an orthographic projection of the other of the two first electrodes 2323 on the base substrate and the orthographic projection of the second electrode 2324 on the base substrate. This structure is advantageous to reduce the space occupied by the multiplexer.

In some embodiments, as shown in FIG. 12, the active layer 2321 comprises a first active portion 2321a and a second active portion 2321b spaced apart from each other. The second active portion 2321b is between the first active portion 2321a and the display area. Each first electrode 2323 and the second electrode 2324 each are electrically connected to the first active portion 2321a through a plurality of sixteenth conductive vias V16, and the each first electrode 2323 and the second electrode 2324 each are electrically connected to the second active portion 2321b through a plurality of seventeenth conductive vias V17. In the embodiment, the active layer 2321 comprises a first active portion 2321a and a second active portion 2321b spaced apart from each other. Such a structure is conducive to the heat dissipation of the transistors and can improve the reliability of the multiplexer.

Figure 13:
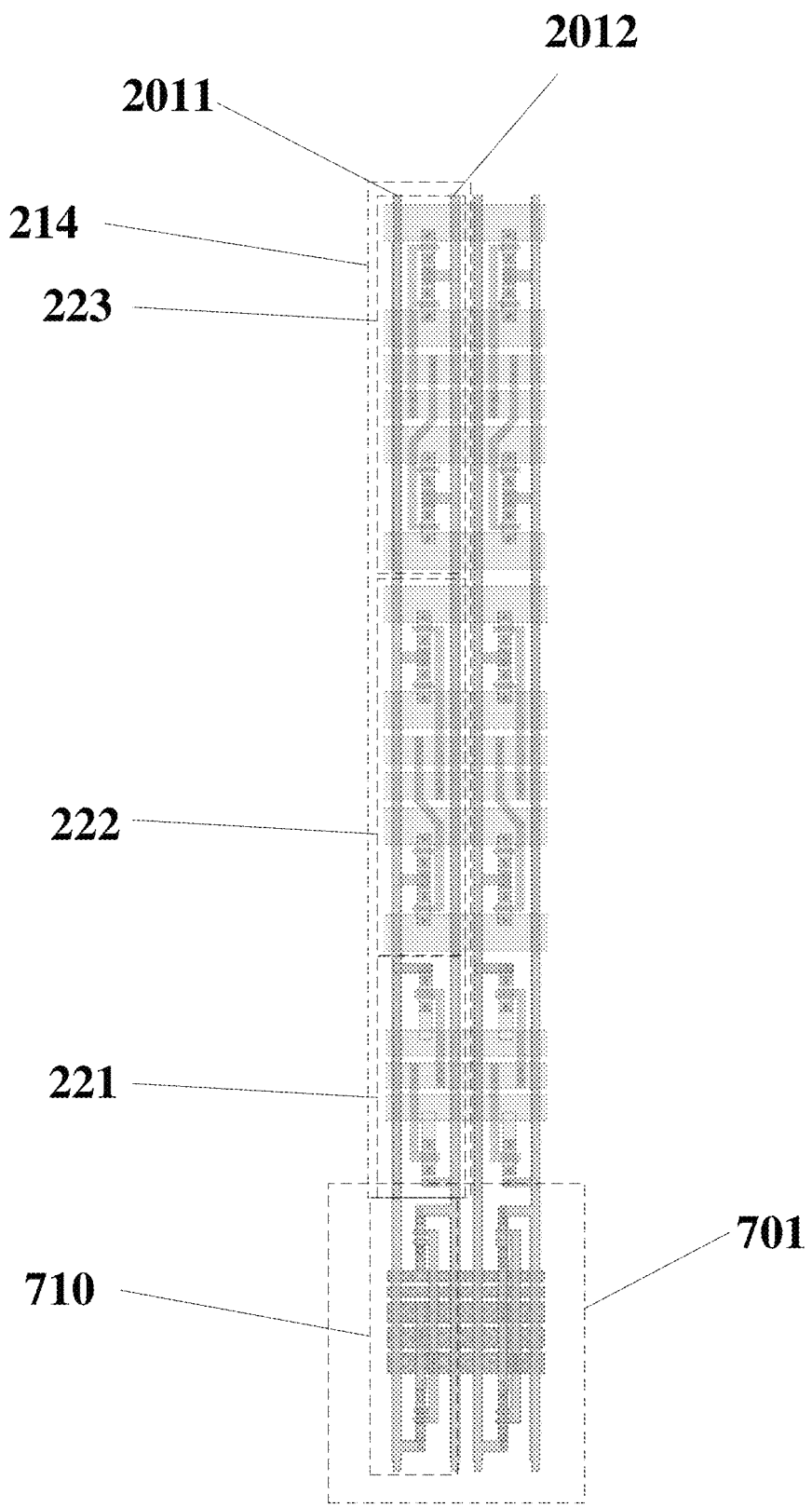
FIG. 13 is a top view showing a layout of a first test circuit and a second test circuit according to an embodiment of the present disclosure.
Figure 14:
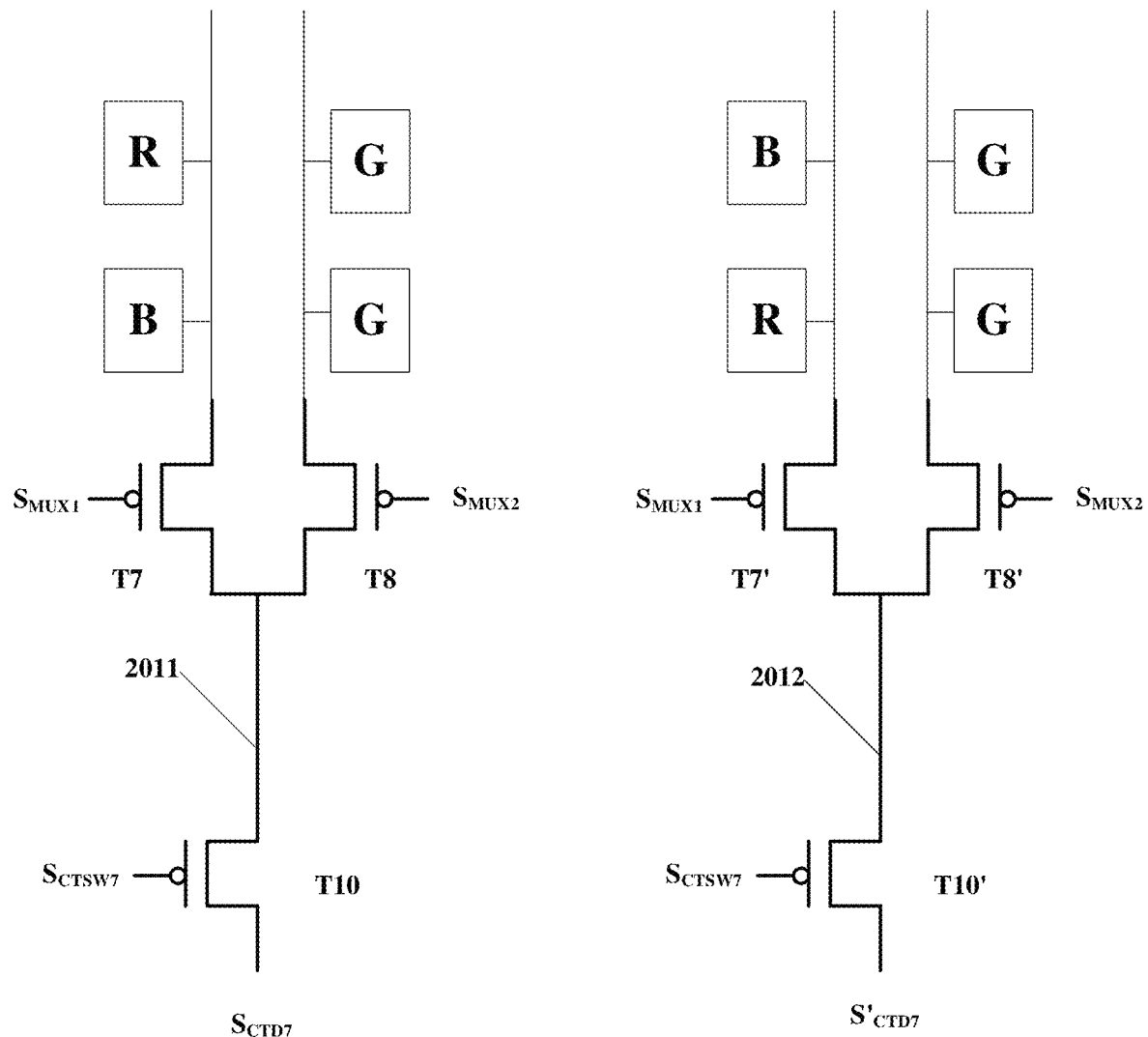
FIG. 14 is a circuit connection diagram showing a second test circuit according to an embodiment of the present disclosure.

FIG. 13 is a top view showing a layout of a first test circuit and a second test circuit according to an embodiment of the present disclosure. FIG. 14 is a circuit connection diagram showing a second test circuit according to an embodiment of the present disclosure.

In some embodiments, as shown in FIG. 13, the display panel further comprises a second test circuit 701. The second test circuit 701 is on a side of the first test circuit away from the plurality of sub-pixels. The second test circuit is configured to detect whether there is a crack in the display panel. As shown in FIG. 14, the second test circuit 701 comprises a plurality of tenth transistors T10 and T10'. The plurality of tenth transistors are electrically connected to the plurality of multiplexers in one-to-one correspondence. A first electrode of the tenth transistor T10 (or T10') is configured to receive a detection voltage signal $S_{CTD7}$ (or $S'_{CTD7}$). A second electrode of the tenth transistor T10 (or T10') is electrically connected to the input terminal of a multiplexer corresponding to the tenth transistor. A control electrode of the tenth transistor T10 (or T10') is configured to receive a seventh test switch signal $S_{CTSW7}$.

Figure 15:
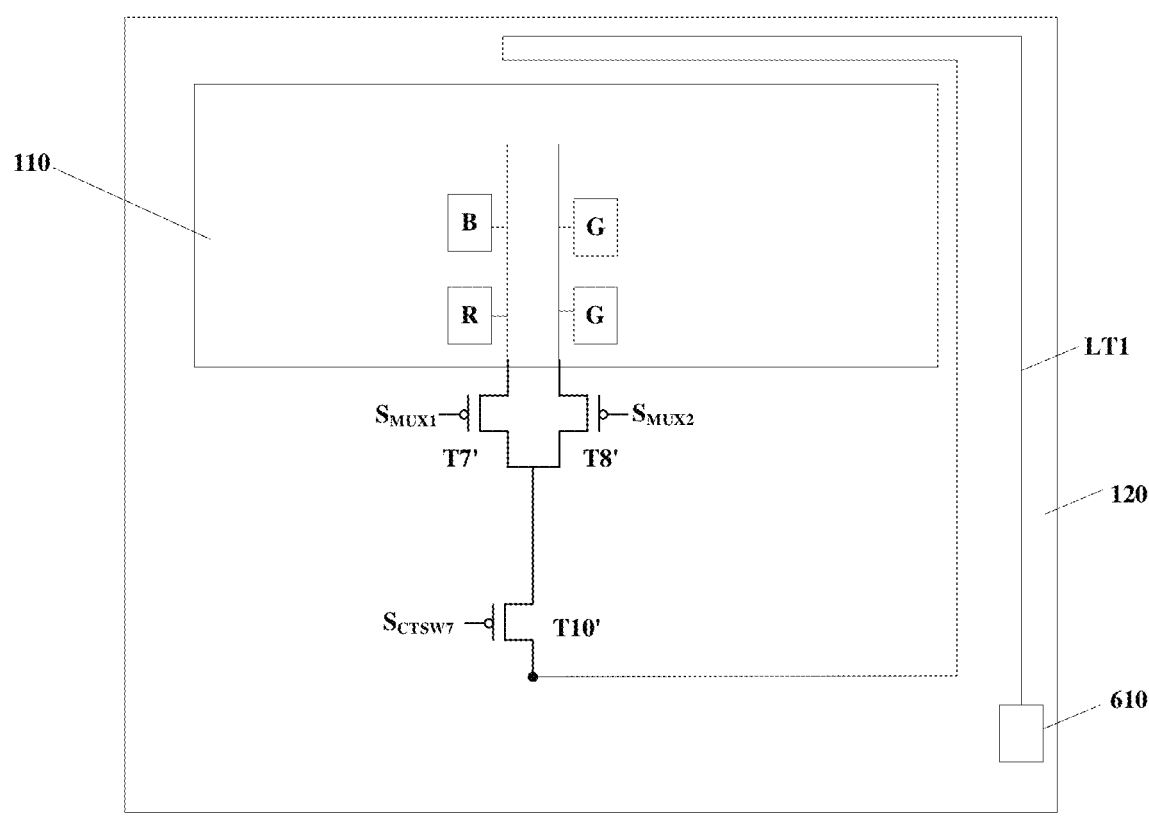
FIG. 15 is a schematic diagram showing a detection principle of a second test circuit according to an embodiment of the present disclosure.

FIG. 15 is a schematic diagram showing a detection principle of a second test circuit according to an embodiment of the present disclosure.

As shown in FIG. 15, the display panel further comprises a first detection line LT1 electrically connected to the first electrode of the tenth transistor T10 and a signal input terminal 610 electrically connected to the first detection line LT1. The signal input terminal 610 is used to output the detection voltage signal $S_{CTD7}$ to the tenth transistor. The first detection line LT1 and the signal input terminal 610 are in the peripheral area 120.

The principle of the second test circuit for detecting whether there is a crack in the display panel will be described below with reference to FIG. 11. Here, a description will be given with the transistors T7', T8', and T10' as an example.

The seventh test switch signal is provided to the tenth transistor T10' to turn on the tenth transistor T10', and the detection voltage signal $S'_{CTD7}$ (for example, at a high level) is provided to the tenth switch transistor T10'. The first selection signal $S_{MUX1}$ is provided to the seventh transistor T7', and the second selection signal $S_{MUX2}$ is provided to the eighth transistor T8'.

In a case where the display panel has no cracks and the first detection line LT1 is not broken, the detection voltage signal $S'_{CTD7}$ at a high level (for example, 6V) is input to corresponding sub-pixels through the tenth transistor T10' and the seventh transistor T7' (or the eighth transistor T8), so that the current flowing through the light emitting devices (such as OLED) of the sub-pixels is relatively small. The light emitting devices hardly emit light. In this way, the display panel displays a black screen. Therefore, if the display panel displays a black screen, it means that the display panel has no cracks.

In a case where the display panel has a crack and the first detection line LT1 is broken, the first electrode of the tenth transistor T10' is suspended. It can be considered that the detection voltage signal in this case is approximately 0V. A voltage of 0V is input to the sub-pixels of a corresponding column through the tenth transistor T10' and the seventh transistor T7' (or the eighth transistor T8'), so that the current flowing through the light emitting devices of the column of sub-pixels is relatively large, causing that the light emitting devices emit light. Thus, the display panel shows a bright line.

Therefore, in the case where the first selection signal and the second selection signal cause the seventh transistor and the eighth transistor to be turned on alternately, if there is a crack in the display panel, all the red sub-pixels R, the green sub-pixels G, and the blue sub-pixels B emit light, which causes the display panel to display a white bright line. Therefore, in such a case, if the display panel displays a white bright line, it is determined that the display panel has a crack.

In the case where the first selection signal turns off the seventh transistor and the second selection signal turns on the eighth transistor, if there is a crack in the display panel, the green sub-pixels G emit light, while the red sub-pixels R and blue sub-pixels B do not emit light, causing that the display panel displays a green bright line. Therefore, in such a case, if the display panel displays a green bright line, it is determined that the display panel has a crack.

In the case where the first selection signal turns on the seventh transistor and the second selection signal turns off the eighth transistor, if there is a crack in the display panel, the red sub-pixels R and the blue sub-pixels B emit light, while the green sub-pixels G do not emit light. Here, The light emission of the red sub-pixels R and the blue sub-pixels B causes the display panel to display a magenta bright line. Therefore, in such a case, if the display panel displays a magenta bright line, it is determined that the display panel has a crack.

Heretofore, the principle of the second test circuit for detecting whether there is a crack in the display panel has been described. The detection method is relatively simple and convenient for detection.

Figures 16, 17:
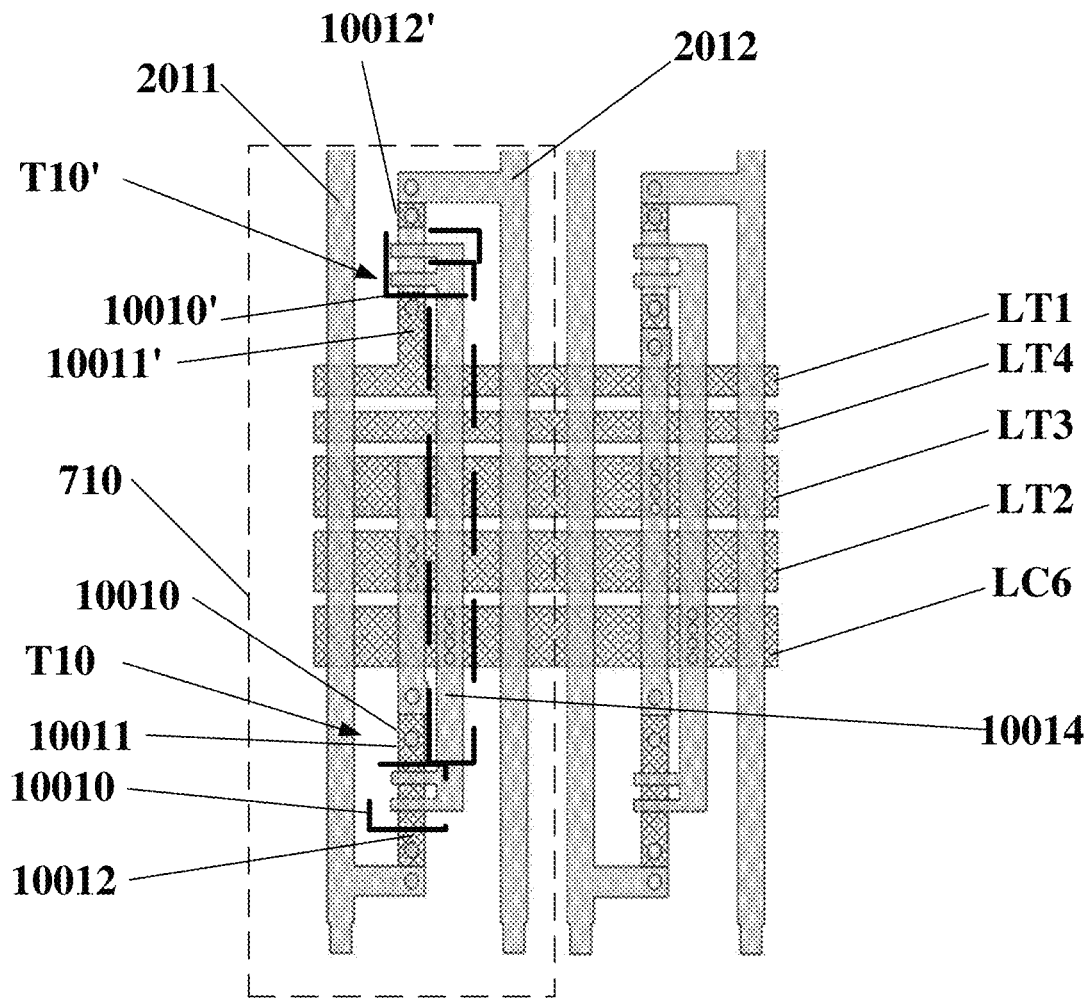
FIG. 16 is a schematic top view showing a layout of a second test circuit according to an embodiment of the present disclosure.
FIG. 17 is a flowchart showing a test method for a display panel according to an embodiment of the present disclosure.

FIG. 16 is a schematic top view showing a layout of a second test circuit according to an embodiment of the present disclosure.

As shown in FIG. 16, the second test circuit comprises a plurality of test components (for example, it may be referred to as second test components). Each second test component comprises two tenth transistors. For example, a second test component 710 comprises two tenth transistors T10 and T10'.

As shown in FIG. 16, the tenth transistor T10 comprises a control electrode 10010, a first electrode 10011, and a second electrode 10012. The control electrode 10010 of the tenth transistor T10 is electrically connected to a sixth control line LC6 through a seventh connector 10014 and a conductive via. The sixth control line LC6 is configured to transmit the seventh test switch signal $S_{CTSW7}$. The first electrode 10011 of the tenth transistor T10 is electrically connected to a second detection line LT2. The second detection line LT2 is configured to transmit one detection voltage signal $S_{CTD7}$. The second electrode 10012 of the tenth transistor T10 is electrically connected to the first connection wire 2011.

As shown in FIG. 16, the tenth transistor T10' comprises a control electrode 10010', a first electrode 10011', and a second electrode 10012'. The control electrode 10010' of the tenth transistor T10' is electrically connected to the sixth control line LC6 through the seventh connector 10014 and a conductive via. The first electrode 10011' of the tenth transistor T10' is electrically connected to a first detection line LT1. The first detection line LT1 is configured to transmit another detection voltage signal $S'_{CTD7}$. The second electrode 10012' of the tenth transistor T10' is electrically connected to the second connection wire 2012.

In some embodiments, orthographic projections of the sixth control line LC6, the first detection line LT1 and the second detection line LT2 on the base substrate are between orthographic projections of the two tenth transistors T10 and T10' of the second test component on the base substrate.

In addition, FIG. 16 also shows a third detection line LT3 and a fourth detection line LT4. The third detection line LT3 and the fourth detection line LT4 are each configured to provide detection voltage signals to the tenth transistors of other second test components.

In an embodiment of the present disclosure, a display device is further provided. The display device comprises the display panel as described above. For example, the display device may be any product or component with a display function, such as a mobile phone, a tablet computer, a television, a display, a notebook computer, a digital frame, a navigator, or the like.

FIG. 17 is a flowchart showing a test method for a display panel according to an embodiment of the present disclosure. As shown in FIG. 17, the test method comprises steps S1702 to S1704.

At step S1702, a data signal is transmitted to a multiplexer electrically connected to each test component (that is, each test component of the first test circuit) by the each test component under the control of a test switch signal.

For example, the test switch signal comprises at least one of the first test switch signal to the sixth test switch signal.

At step S1704, the data signal is transmitted to a corresponding sub-pixel by the multiplexer under the control of a selection signal.

For example, the selection signal comprises at least one of the first selection signal or the second selection signal.

Heretofore, a test method according to some embodiments of the present disclosure is provided. The test method comprises: transmitting a data signal to a multiplexer electrically connected to a test component of the first test circuit by the test component under a control of a test switch signal; and transmitting the data signal to a corresponding sub-pixel by the multiplexer under the control of a selection signal, thereby realizing the test of the display panel.

Figure 18:
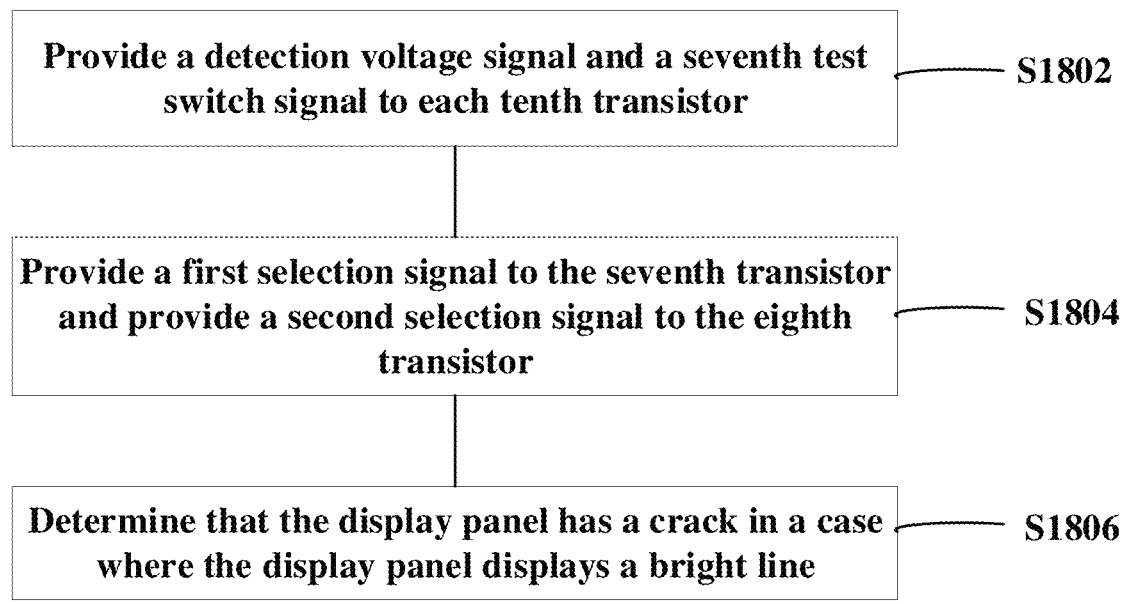
FIG. 18 is a flowchart showing a crack detection method for a display panel according to an embodiment of the present disclosure.

FIG. 18 is a flowchart showing a crack detection method for a display panel according to an embodiment of the present disclosure. As shown in FIG. 18, the crack detection method comprises steps S1802 to S1806.

At step S1802, a detection voltage signal and a seventh test switch signal are provided to each tenth transistor.

At step S1804, a first selection signal is provided to the seventh transistor, and a second selection signal is provided to the eighth transistor.

At step S1806, it is determined that the display panel has a crack in a case where the display panel displays a bright line.

In some embodiments, the step S1806 comprises: determining that the display panel has the crack if the display panel displays a white bright line in a case where the first selection signal and the second selection signal cause the seventh transistor and the eighth transistor to be turned on alternately; determining that the display panel has the crack if the display panel displays a green bright line in a case where the first selection signal turns off the seventh transistor and the second selection signal turns on the eighth transistor; or determining that the display panel has the crack if the display panel displays a magenta bright line in a case where the first selection signal turns on the seventh transistor and the second selection signal turns off the eighth transistor.

Heretofore, a crack detection method according to some embodiments of the present disclosure is provided. The crack detection method comprises: providing the detection voltage signal and the seventh test switch signal to each tenth transistor; providing the first selection signal to the seventh transistor, and providing the second selection signal to the eighth transistor; and determining that the display panel has a crack in a case where the display panel displays a bright line. In this way, the crack detection of the display panel is realized.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above-described embodiments or equivalently substitution of part of the technical features may be made without departing from the scope and spirit of the present disclosure. The scope of the present disclosure is defined by the appended claims.

What is claimed is:

1. A display panel, comprising:
a base substrate comprising a display area and a peripheral area on at least one side of the display area;
a plurality of sub-pixels on a side of the base substrate and in the display area;
a plurality of data signal lines in the display area and electrically connected to the plurality of sub- pixels;
a plurality of signal transmission lines in the peripheral area and electrically connected to the plurality of data signal lines;
a plurality of multiplexers in the peripheral area and on a side of the plurality of signal transmission lines away from the plurality of sub-pixels, at least one of the plurality of multiplexers being electrically connected to at least two signal transmission lines, wherein each of the plurality of multiplexers comprises a seventh transistor and an eighth transistor, wherein the seventh transistor and the eighth transistor share a first electrode serving as an input terminal of the each of the plurality of multiplexers, a second electrode of the seventh transistor is electrically connected to one of the at least two signal transmission lines, a control electrode of the seventh transistor is configured to receive a first selection signal, a second electrode of the eighth transistor is electrically connected to another of the at least two signal transmission lines, and a control electrode of the eighth transistor is configured to receive a second selection signal; and
a first test circuit in the peripheral area and one a side of the plurality of multiplexers away from the plurality of sub-pixels, the first test circuit comprising a plurality of test components, each test component of at least a portion of the plurality of test components being electrically connected to as least two of the plurality of multiplexers, and the each test component comprising a first test sub-circuit, a second test sub-circuit, and a third test sub-circuit, the second test sub-circuit being between the first test sub-circuit and the third test sub-circuit, and the first test sub-circuit being on a side of the second test sub-circuit away from the plurality of sub-pixels, wherein two adjacent multiplexers of the plurality of multiplexers are electrically connected to one of the plurality of test components through two connection wires,
wherein the plurality of multiplexers comprise a first multiplexer and a second multiplexer;
the first test sub-circuit comprises: a first transistor, a first electrode of the first transistor being configured to receive a first data signal, a second electrode of the first transistor being electrically connected to an input terminal of the first multiplexer, and a control electrode of the first transistor being configured to receive a first test switch signal; and a second transistor, a first electrode of the second transistor being configured to receive a second data signal, a second electrode of the second transistor being electrically connected to an input terminal of the second multiplexer, and a control electrode of the second transistor being configured to receive a second test switch signal;
the second test sub-circuit comprises: a third transistor, a first electrode of the third transistor being configured to receive a third data signal, a second electrode of the third transistor being electrically connected to the input terminal of the first multiplexer, and a control of the third transistor being configured to receive a third test switch signal; and a fourth transistor, a first electrode of the fourth transistor being configured to receive a fourth data signal, a second electrode of the fourth transistor being electrically connected to the input terminal of the first multiplexer, and a control electrode of the fourth transistor being configured to receive a fourth test switch signal; and the third test sub-circuit comprises: a fifth transistor, a first electrode of the fifth transistor being configured to receive a fifth data signal, a second electrode of the fifth transistor being electrically connected to the input terminal of the second multiplexer, and a control electrode of the fifth transistor being configured to receive a fifth test switch signal; and a sixth transistor, a first electrode of the sixth transistor being configured to receive a sixth data signal, a second electrode of the sixth transistor being electrically connected to the input terminal of the second multiplexer, and a control electrode of the sixth transistor being configured to receive a sixth test switch signal.

2. The display panel according to claim 1, wherein an orthographic projection of the first test sub-circuit on the base substrate is centrosymmetric with respect to a geometric center of the orthographic projection.

3. The display panel according to claim 1, further comprising:
a first control line electrically connected to the control electrode of the first transistor and the control electrode of the second transistor and configured to transmit the first test switch signal and the second test switch signal, the first test switch signal being the same as the second test switch signal;
a first data line electrically connected to the first electrode of the first transistor and configured to transmit the first data signal; and
a second data line electrically connected to the first electrode of the second transistor and configured to transmit the second data signal;
wherein an orthographic projection of the first control line on the base substrate is between an orthographic projection of the first data line on the base substrate and an orthographic projection of the second data line on the base substrate.

4. The display panel according to claim 3, wherein the two connection wires comprise a first connection wire and a second connection wire, wherein:
the second electrode of the first transistor is electrically connected to the first connection wire, and the second electrode of the second transistor is electrically connected to the second connection wire;
an orthographic projection of the control electrode of the first transistor on the base substrate is between an orthographic projection of the first electrode of the first transistor on the base substrate and an orthographic projection of the second electrode of the first transistor on the base substrate;
an orthographic projection of the control electrode of the second transistor on the base substrate is between an orthographic projection of the first electrode of the second transistor on the base substrate and an orthographic projection of the second electrode of the second transistor on the base substrate; and
the orthographic projection of the first electrode of the first transistor on the base substrate and the orthographic projection of the first electrode of the second transistor on the base substrate are between the orthographic projection of the control electrode of the first transistor on the base substrate and the orthographic projection of the control electrode of the second transistor on the base substrate.

5. The display panel according to claim 4, wherein:
the third transistor comprises two first electrodes, one second electrode, and two control electrodes; and the fourth transistor comprises two first electrodes, one second electrode, and two control electrodes; and
the display panel further comprises:
a second control line electrically connected to the two control electrodes of the third transistor and configured to transmit the third test switch signal;
a third data line electrically connected to one of the two first electrodes of the third transistor and configured to transmit the third data signal;
a fourth data line electrically connected to another of the two first electrodes of the third transistor and configured to transmit the third data signal;
a third control line electrically connected to the two control electrodes of the fourth transistor and configured to transmit the fourth test switch signal;
a fifth data line electrically connected to one of the two first electrodes of the fourth transistor and configured to transmit the fourth data signal; and
a sixth data line electrically connected to another of the two first electrodes of the fourth transistor and configured to transmit the fourth data signal;
wherein an orthographic projection of the second control line on the base substrate is between an orthographic projection of the third control line on the base substrate and an orthographic projection of the sixth data line on the base substrate, the orthographic projection of the third control line on the base substrate is between the orthographic projection of the second control line on the base substrate and an orthographic projection of the third data line on the base substrate, and the orthographic projection of the third data line on the base substrate and the orthographic projection of the sixth data line on the base substrate are between an orthographic projection of the third transistor on the base substrate and an orthographic projection of the fourth transistor on the base substrate.

6. The display panel according to claim 5, wherein:
the second electrode of the third transistor and the second electrode of the fourth transistor are electrically connected to the first connection wire;
an orthographic projection of one of the two control electrodes of the third transistor on the base substrate is between an orthographic projection of the one of the two first electrodes of the third transistor on the base substrate and an orthographic projection of the second electrode of the third transistor on the base substrate, and an orthographic projection of another of the two control electrodes of the third transistor on the base substrate is between an orthographic projection of the another of the two first electrodes of the third transistor on the base substrate and the orthographic projection of the second electrode of the third transistor on the base substrate; and
an orthographic projection of one of the two control electrodes of the fourth transistor on the base substrate is between an orthographic projection of the one of the two first electrodes of the fourth transistor on the base substrate and an orthographic projection of the second electrode of the fourth transistor on the base substrate, and an orthographic projection of another of the two control electrodes of the fourth transistor on the base substrate is between an orthographic projection of the another of the two first electrodes of the fourth transistor on the base substrate and the orthographic projection of the second electrode of the fourth transistor on the base substrate.

7. The display panel according to claim 6, wherein:
the fifth transistor comprises two first electrodes, one second electrode, and two control electrodes; and the sixth transistor comprises two first electrodes, one second electrode, and two control electrodes;
the display panel further comprises:
a fourth control line electrically connected to the two control electrodes of the fifth transistor and configured to transmit the fifth test switch signal;
a seventh data line electrically connected to one of the two first electrodes of the fifth transistor and configured to transmit the fifth data signal;
an eighth data line electrically connected to another of the two first electrodes of the fifth transistor and configured to transmit the fifth data signal;
a fifth control line electrically connected to the two control electrodes of the sixth transistor and configured to transmit the sixth test switch signal;
a ninth data line electrically connected to one of the two first electrodes of the sixth transistor and configured to transmit the sixth data signal; and
a tenth data line electrically connected to another of the two first electrodes of the sixth transistor and configured to transmit the sixth data signal;
wherein an orthographic projection of the fourth control line on the base substrate is between an orthographic projection of the fifth control line on the base substrate and an orthographic projection of the ninth data line on the base substrate, the orthographic projection of the fifth control line on the base substrate is between the orthographic projection of the fourth control line on the base substrate and an orthographic projection of the seventh data line on the base substrate, and the orthographic projection of the seventh data line on the base substrate and the orthographic projection of the ninth data line on the base substrate are between an orthographic projection of the fifth transistor on the base substrate and an orthographic projection of the sixth transistor on the base substrate.

8. The display panel according to claim 7, wherein:
the second electrode of the fifth transistor and the second electrode of the sixth transistor are electrically connected to the second connection wire;
an orthographic projection of one of the two control electrodes of the fifth transistor on the base substrate is between an orthographic projection of the one of the two first electrodes of the fifth transistor on the base substrate and an orthographic projection of the second electrode of the fifth transistor on the base substrate, and an orthographic projection of another of the two control electrodes of the fifth transistor on the base substrate is between an orthographic projection of the another of the two first electrodes of the fifth transistor on the base substrate and the orthographic projection of the second electrode of the fifth transistor on the base substrate; and
an orthographic projection of one of the two control electrodes of the sixth transistor on the base substrate is between an orthographic projection of the one of the two first electrodes of the sixth transistor on the base substrate and an orthographic projection of the second electrode of the sixth transistor on the base substrate, and an orthographic projection of another of the two control electrodes of the sixth transistor on the base substrate is between an orthographic projection of the another of the two first electrodes of the sixth transistor on the base substrate and the orthographic projection of the second electrode of the sixth transistor on the base substrate.

9. The display panel according to claim 8, wherein at least one sub-pixel of the plurality of sub-pixels comprises a ninth transistor and a capacitor;
the ninth transistor comprising:
an active layer;
a first insulating layer covering the active layer;
a gate on a side of the first insulating layer away from the active layer;
a second insulating layer covering the gate;
an interlayer insulating layer on a side of the second insulating layer away from the gate; and
a source and a drain both on a side of the interlayer insulating layer away from the second insulating layer, wherein the source and the drain each are electrically connected to the active layer; and
the capacitor comprising:
a first conductive layer in the same layer as the gate and being covered by the second insulating layer; and
a second conductive layer on a side of the second insulating layer away from the first conductive layer and being covered by the interlayer insulating layer.

10. The display panel according to claim 9, wherein the at least one sub-pixel further comprises:
a third insulating layer covering the source and the drain;
a planarization layer on a side of the third insulating layer away from the source and the drain;
an anode layer on a side of the planarization layer away from the third insulating layer, wherein the anode layer is electrically connected to the source or the drain;
a pixel defining layer on a side of the planarization layer away from the third insulating layer and having an opening exposing at least a portion of the anode layer;
a functional layer at least within the opening and connected to the anode layer; and
a cathode layer on a side of the functional layer away from the anode layer.

11. The display panel according to claim 10, wherein:
the first connection wire is in the same layer as the second conductive layer, and the second connection wire is in the same layer as the gate;
the first control line to the fifth control line and the first data line to the tenth data line are all in the same layer as the source or the drain; and
control electrodes of the first transistor to the sixth transistor are in the same layer as the gate, active layers of the first transistor to the sixth transistor are in the same layer as the active layer of the ninth transistor, first electrodes of the first transistor to the sixth transistor are all in the same layer as the source or the drain, and second electrodes of the first transistor to the sixth transistor are all in the same layer as the source or the drain.

12. The display panel according to claim 1, further comprising:
a second test circuit comprising a plurality of tenth transistors being electrically connected to the plurality of multiplexers in one-to-one correspondence;

wherein a first electrode of each of the plurality of tenth transistors is configured to receive a detection voltage signal, a second electrode of the each of the plurality of tenth transistors is electrically connected to the input terminal of a multiplexer corresponding to the each of the plurality of tenth transistors, and a control electrode of the each of the plurality of tenth transistors is configured to receive a seventh test switch signal.

13. The display panel according to claim 1, further comprising:
   a first signal access terminal group in the peripheral area and on a side of the first test circuit in an extension direction along a boundary between the display area and the peripheral area, the first signal access terminal group being electrically connected to the first test circuit; and
   a second signal access terminal group in the peripheral area and on a side of the first test circuit away from the first signal access terminal group in the extension direction along the boundary between the display area and the peripheral area, the second signal access terminal group being electrically connected to the first test circuit.

14. A display device, comprising: the display panel according to claim 1.

15. A test method for a display panel, the display panel, comprising: a base substrate comprising a display area and a peripheral area on at least one side of the display area; a plurality of sub-pixels on a side of the base substrate and in the display area; a plurality of data signal lines in the display area and electrically connected to the plurality of sub-pixels; a plurality of signal transmission lines in the peripheral area and electrically connected to the plurality of data signal lines; a plurality of multiplexers in the peripheral area and on a side of the plurality of signal transmission lines away from the plurality of sub-pixels, at least one of the plurality of multiplexers being electrically connected to at least two signal transmission lines, wherein each of the plurality of multiplexers comprises a seventh transistor and an eighth transistor, wherein the seventh transistor and the eighth transistor share a first electrode serving as an input terminal of the each of the plurality of multiplexers, a second electrode of the seventh transistor is electrically connected to one of the at least two signal transmission lines, a control electrode of the seventh transistor is configured to receive a first selection signal, a second electrode of the eighth transistor is electrically connected to another of the at least two signal transmission lines, and a control electrode of the eighth transistor is configured to receive a second selection signal; and a first test circuit in the peripheral area and one a side of the plurality of multiplexers away from the plurality of sub-pixels, the first test circuit comprising a plurality of test components, each test component of at least a portion of the plurality of test components being electrically connected to as least two of the plurality of multiplexers, and the each test component comprising a first test sub-circuit, a second test sub-circuit, and a third test sub-circuit, the second test sub-circuit being between the first test sub-circuit and the third test sub-circuit, and the first test sub-circuit being on a side of the second test sub-circuit away from the plurality of sub-pixels, wherein two adjacent multiplexers of the plurality of multiplexers are electrically connected to one of the plurality of test components through two connection wires, wherein the plurality of multiplexers comprise a first multiplexer and a second multiplexer; the first test sub-circuit comprises: a first transistor, a first electrode of the first transistor being configured to receive a first data signal, a second electrode of the first transistor being electrically connected to an input terminal of the first multiplexer, and a control electrode of the first transistor being configured to receive a first test switch signal; and a second transistor, a first electrode of the second transistor being configured to receive a second data signal, a second electrode of the second transistor being electrically connected to an input terminal of the second multiplexer, and a control electrode of the second transistor being configured to receive a second test switch signal; the second test sub-circuit comprises: a third transistor, a first electrode of the third transistor being configured to receive a third data signal, a second electrode of the third transistor being electrically connected to the input terminal of the first multiplexer, and a control of the third transistor being configured to receive a third test switch signal; and a fourth transistor, a first electrode of the fourth transistor being configured to receive a fourth data signal, a second electrode of the fourth transistor being electrically connected to the input terminal of the first multiplexer, and a control electrode of the fourth transistor being configured to receive a fourth test switch signal; and
   the third test sub-circuit comprises: a fifth transistor, a first electrode of the fifth transistor being configured to receive a fifth data signal, a second electrode of the fifth transistor being electrically connected to the input terminal of the second multiplexer, and a control electrode of the fifth transistor being configured to receive a fifth test switch signal; and a sixth transistor, a first electrode of the sixth transistor being configured to receive a sixth data signal, a second electrode of the sixth transistor being electrically connected to the input terminal of the second multiplexer, and a control electrode of the sixth transistor being configured to receive a sixth test switch signal; and
   the test method comprising:
   transmitting a data signal to a multiplexer electrically connected to the each test component by the each test component under a control of a test switch signal; and
   transmitting the data signal to a corresponding sub-pixel by the multiplexer under a control of a selection signal.

16. A crack detection method for a display panel, the display panel comprising: a base substrate comprising a display area and a peripheral area on at least one side of the display area; a plurality of sub-pixels on a side of the base substrate and in the display area; a plurality of data signal lines in the display area and electrically connected to the plurality of sub-pixels; a plurality of signal transmission lines in the peripheral area and electrically connected to the plurality of data signal lines; a plurality of multiplexers in the peripheral area and on a side of the plurality of signal transmission lines away from the plurality of sub-pixels, at least one of the plurality of multiplexers being electrically connected to at least two signal transmission lines, each of the plurality of multiplexers comprising a seventh transistor and an eighth transistor, wherein the seventh transistor and the eighth transistor share a first electrode serving as an input terminal of the each of the plurality of multiplexers, a second electrode of the seventh transistor is electrically connected to one of the at least two signal transmission lines, a control electrode of the seventh transistor is configured to receive a first selection signal, a second electrode of the eighth transistor is electrically connected to another of the at least two signal transmission lines, and a control electrode of the eighth transistor is configured to receive a second selection signal; a first test circuit in the peripheral area and on a side of the plurality of multiplexers away from the plurality of sub-pixels, the first test circuit comprising a plurality of test components, each test component of at least a portion of the plurality of test components being electrically connected to at least two of the plurality of multiplexers, and the each test component comprising a first test sub-circuit, a second test sub-circuit and a third test sub-circuit, the second test sub-circuit being between the first test sub-circuit and the third test sub-circuit, and the first test sub-circuit being on a side of the second test sub-circuit away from the plurality of sub-pixels, wherein two adjacent multiplexer of the plurality of multiplexers are electrically connected to one of the plurality of test components through two connection wires; wherein the plurality of multiplexers comprise a first multiplexer and a second multiplexer; the first test sub-circuit comprises: a first transistor, a first electrode of the first transistor being configured to receive a first data signal, a second electrode of the first transistor being electrically connected to an input terminal of the first multiplexer, and a control electrode of the first transistor being configured to receive a first test switch signal; and a second transistor, a first electrode of the second transistor being configured to receive a second data signal, a second electrode of the second transistor being electrically connected to an input terminal of the second multiplexer, and a control electrode of the second transistor being configured to receive a second test switch signal; the second test sub-circuit comprises: a third transistor, a first electrode of the third transistor being configured to receive a third data signal, a second electrode of the third transistor being electrically connected to the input terminal of the first multiplexer, and a control of the third transistor being configured to receive a third test switch signal; and a fourth transistor, a first electrode of the fourth transistor being configured to receive a fourth data signal, a second electrode of the fourth transistor being electrically connected to the input terminal of the first multiplexer. and a control electrode of the fourth transistor being configured to receive a fourth test switch signal; and the third test sub-circuit comprises: a fifth transistor, a first electrode of the fifth transistor being configured to receive a fifth data signal, a second electrode of the fifth transistor being electrically connected to the input terminal of the second multiplexer, and a control electrode of the fifth transistor being configured to receive a fifth test switch signal; and a sixth transistor, a first electrode of the sixth transistor being configured to receive a sixth data signal, a second electrode of the sixth transistor being electrically connected to the input terminal of the second multiplexer, and a control electrode of the sixth transistor being configured to receive a sixth test switch signal; and a second test circuit comprising a plurality of tenth transistors being electrically connected to the plurality of multiplexers in one-to-one correspondence, wherein a first electrode of each of the plurality of tenth transistors is configured to receive a detection voltage signal, a second electrode of the each of the plurality of tenth transistors is electrically connected to the input terminal of a multiplexer corresponding to the each of the plurality of tenth transistors, and a control electrode of the each of the plurality of tenth transistors is configured to receive a seventh test switch signal; and the crack detection method comprising:

providing the detection voltage signal and the seventh test switch signal to the each of the plurality of tenth transistors;

providing the first selection signal to the seventh transistor and providing the second selection signal to the eighth transistor; and determining that the display panel has a crack in a case where the display panel displays a bright line.

17. The crack detection method according to claim 16, wherein the determining that the display panel has the crack comprises:

determining that the display panel has the crack if the display panel displays a white bright line in a case where the first selection signal and the second selection signal cause the seventh transistor and the eighth transistor to be turned on alternately;

determining that the display panel has the crack if the display panel displays a green bright line in a case where the first selection signal turns off the seventh transistor and the second selection signal turns on the eighth transistor; or determining that the display panel has the crack if the display panel displays a magenta bright line in a case where the first selection signal turns on the seventh transistor and the second selection signal turns off the eighth transistor.

\* \* \* \* \*

UNITED STATES PATENT AND TRADEMARK OFFICE
CERTIFICATE OF CORRECTION

| | | |
|---|---|---|
| PATENT NO. | : 12,150,369 B2 | Page 1 of 1 |
| APPLICATION NO. | : 17/275230 | |
| DATED | : November 19, 2024 | |
| INVENTOR(S) | : Linhong Han | |

It is certified that error appears in the above-identified patent and that said Letters Patent is hereby corrected as shown below:

In the Claims

Column 26, Line 34, Claim 1, delete "one" and insert -- on --

Column 26, Line 39, Claim 1, delete "as" and insert -- at --

Column 31, Line 50, Claim 15, delete "one" and insert -- on --

Column 31, Line 55, Claim 15, delete "as" and insert -- at --

Column 33, Line 9, Claim 16, delete "multiplexer" and insert -- multiplexers --

Column 33, Line 34, Claim 16, delete "multiplexer." and insert -- multiplexer, --

Signed and Sealed this
Seventh Day of January, 2025

Derrick Brent
*Acting Director of the United States Patent and Trademark Office*